United States Patent [19]
Agrawal et al.

[11] Patent Number: 6,100,715
[45] Date of Patent: Aug. 8, 2000

[54] METHODS FOR CONFIGURING FPGA'S HAVING VARIABLE GRAIN BLOCKS AND LOGIC FOR PROVIDING TIME-SHARED ACCESS TO INTERCONNECT RESOURCES

[75] Inventors: Om P. Agrawal, Los Altos; Bradley A. Sharpe-Geisler, San Jose; Herman M. Chang, Cupertino; Bai Nguyen; Giap H. Tran, both of San Jose, all of Calif.

[73] Assignee: Vantis Corporation, Sunnyvale, Calif.

[21] Appl. No.: 09/212,330

[22] Filed: Dec. 15, 1998

[51] Int. Cl.[7] .................................................. A03K 19/177

[52] U.S. Cl. .............................................. 326/39; 326/41

[58] Field of Search ........................................ 326/37–41

[56] References Cited

U.S. PATENT DOCUMENTS

| | | | |
|---|---|---|---|
| 5,455,525 | 10/1995 | Ho et al. | 326/41 |
| 5,483,178 | 1/1996 | Costello et al. | 326/41 |
| 5,581,199 | 12/1996 | Pierce et al. | 326/41 |
| 5,801,546 | 9/1998 | Pierce et al. | 326/41 |
| 5,872,463 | 2/1999 | Pedersen | 326/41 |
| 5,883,526 | 3/1999 | Reddy et al. | 326/41 |

*Primary Examiner*—Jon Santamauro
*Assistant Examiner*—Don Phu Le
*Attorney, Agent, or Firm*—Fliesler, Dubb, Meyer & Lovejoy LLP; Gideon Gimlan

[57] ABSTRACT

A Variable Grain Architecture (VGA) includes a shared output component (SOC) that may be used for outputting different signals onto a shared longline within an FPGA. Plural VGB's make shared use of the SOC to out respective function signals to the shared longline.

8 Claims, 15 Drawing Sheets

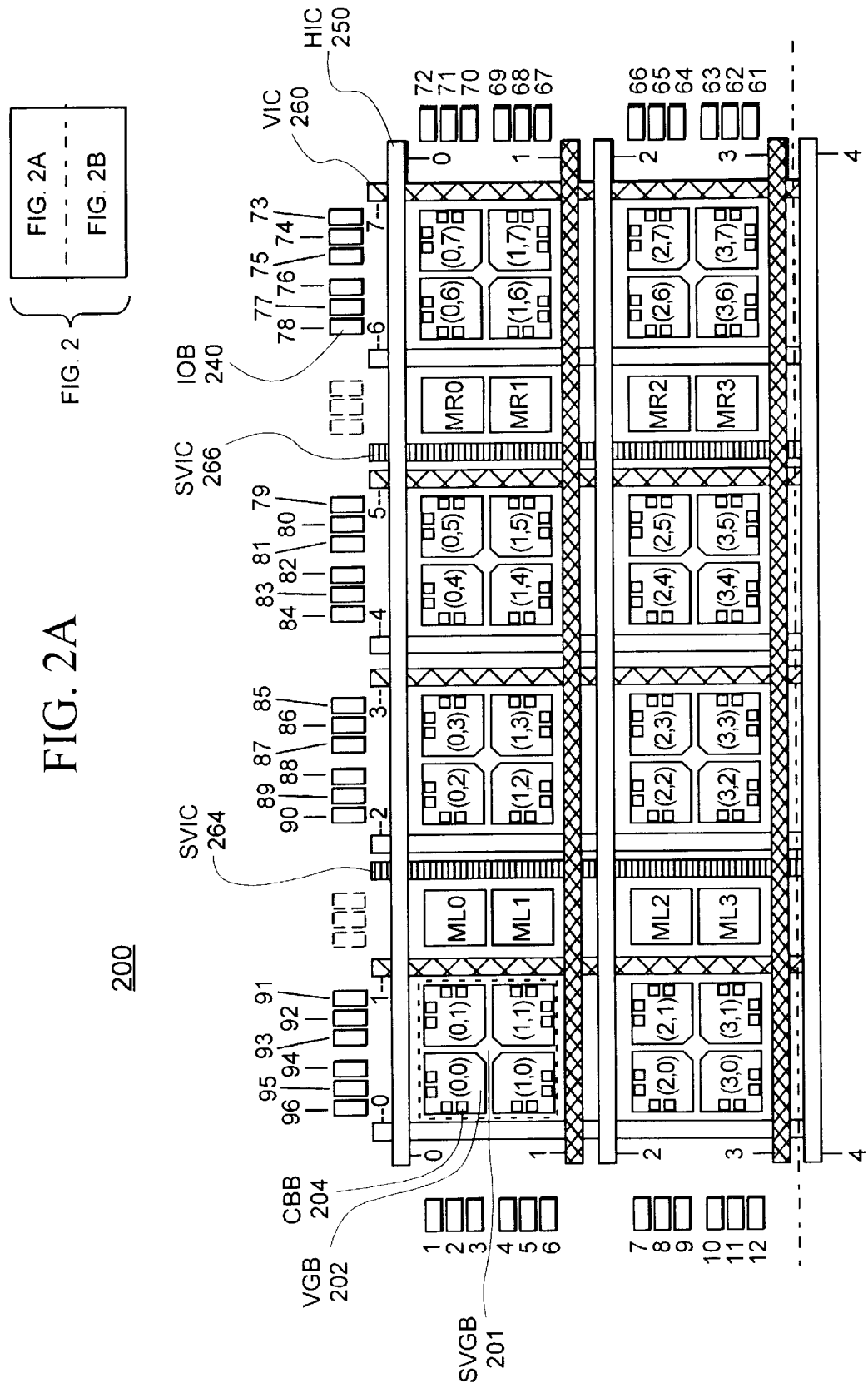

| LLDi | DyOE_J | SupOE_J' | J_Kz0 (IN0) | J_Kz1 (IN1) | J'_Kz2 (IN2) | J'_Kz3 (IN3) | FTK_J0 (IN4) | FTK_J1 (IN5) | FTK_J2 (IN6) | FTK_J3 (IN7) |
|---|---|---|---|---|---|---|---|---|---|---|
| N1 | DyOE_A | DyOE_B | B_Yz | B_Xz | A_Yz | A_Xz | FTX1_B | FTX2_B | FTX1_A | FTX2_A |
| N2 | DyOE_A | DyOE_B | B_Wz | B_Zz | A_Wz | A_Zz | FTX1_B | FTX2_B | FTX1_A | FTX2_A |
| N3 | DyOE_A | DyOE_B | B_Yz | B_Zz | A_Yz | A_Zz | FTX1_B | FTX2_B | FTX1_A | FTX2_A |
| N4 | DyOE_A | DyOE_B | B_Wz | B_Xz | A_Wz | A_Xz | FTX1_B | FTX2_B | FTX1_A | FTX2_A |
| E1 | DyOE_B | DyOE_D | D_Xz | D_Yz | B_Xz | B_Yz | FTY1_D | FTY2_D | FTY1_B | FTY2_B |
| E2 | DyOE_B | DyOE_D | D_Zz | D_Wz | B_Zz | B_Wz | FTY1_D | FTY2_D | FTY1_B | FTY2_B |
| E3 | DyOE_B | DyOE_D | D_Xz | D_Wz | B_Xz | B_Wz | FTY1_D | FTY2_D | FTY1_B | FTY2_B |
| E4 | DyOE_B | DyOE_D | D_Zz | D_Yz | B_Zz | B_Yz | FTY1_D | FTY2_D | FTY1_B | FTY2_B |
| S1 | DyOE_D | DyOE_C | C_Yz | C_Xz | D_Yz | D_Xz | FTX1_C | FTX2_C | FTX1_D | FTX2_D |
| S2 | DyOE_D | DyOE_C | C_Wz | C_Zz | D_Wz | D_Zz | FTX1_C | FTX2_C | FTX1_D | FTX2_D |
| S3 | DyOE_D | DyOE_C | C_Yz | C_Zz | D_Yz | D_Zz | FTX1_C | FTX2_C | FTX1_D | FTX2_D |
| S4 | DyOE_D | DyOE_C | C_Wz | C_Xz | D_Wz | D_Xz | FTX1_C | FTX2_C | FTX1_D | FTX2_D |
| W1 | DyOE_C | DyOE_A | A_Xz | A_Yz | C_Xz | C_Yz | FTY1_A | FTY2_A | FTY1_C | FTY2_C |
| W2 | DyOE_C | DyOE_A | A_Zz | A_Wz | C_Zz | C_Wz | FTY1_A | FTY2_A | FTY1_C | FTY2_C |
| W3 | DyOE_C | DyOE_A | A_Xz | A_Wz | C_Xz | C_Wz | FTY1_A | FTY2_A | FTY1_C | FTY2_C |
| W4 | DyOE_C | DyOE_A | A_Zz | A_Yz | C_Zz | C_Yz | FTY1_A | FTY2_A | FTY1_C | FTY2_C |

FROM COMMON CONTROL SECTION 580

NAME OF SOURCE VGB_ & CBB SIGNAL FROM THAT SOURCE VGB_

FEEDTHROUGHS (FROM NAMED, SOURCE VGB_A, _B, _C OR _D

FIG. 4B

METHODS FOR CONFIGURING FPGA'S HAVING VARIABLE GRAIN BLOCKS AND LOGIC FOR PROVIDING TIME-SHARED ACCESS TO INTERCONNECT RESOURCES

BACKGROUND

1. Field of the Invention

The invention relates generally to integrated circuits having repeated logic and interconnect structures provided therein. The invention relates more specifically to providing time-shared access to limited interconnect resources within field programmable gate arrays (FPGA's).

2a. Cross Reference to Related Applications

The following co-pending U.S. patent applications(s) are owned by the owner of the present application and their disclosures are incorporated herein by reference:

(A) Ser. No. 08/948,306 filed Oct. 9, 1997 by Om P. Agrawal et al. and originally entitled, "VARIABLE GRAIN ARCHITECTURE FOR FPGA INTEGRATED CIRCUITS";

(B) Ser. No. 08/996,361 filed Dec. 22, 1997, by Om Agrawal et al. and originally entitled, "SYMMETRICAL, EXTENDED AND FAST DIRECT CONNECTIONS BETWEEN VARIABLE GRAIN BLOCKS IN FPGA INTEGRATED CIRCUITS";

(C) Ser. No. 08/995,615 filed Dec. 22, 1997, by Om Agrawal et al. and originally entitled, "A PROGRAMMABLE INPUT/OUTPUT BLOCK (IOB) IN FPGA INTEGRATED CIRCUITS";

(D) Ser. No. 08/995,614 filed Dec. 22, 1997, by Om Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";

(E) Ser. No. 08/995,612 filed Dec. 22, 1997, by Om Agrawal et al. and originally entitled, "FLEXIBLE DIRECT CONNECTIONS BETWEEN INPUT/OUTPUT BLOCKs (IOBs) AND VARIABLE GRAIN BLOCKs (VGBs) IN FPGA INTEGRATED CIRCUITS";

(F) Ser. No. 08/997,221 filed Dec. 22, 1997, by Om Agrawal et al. and originally entitled, "PROGRAMMABLE CONTROL MULTIPLEXING FOR INPUT/OUTPUT BLOCKs (IOBs) IN FPGA INTEGRATED CIRCUITS";

(G) Ser. No. 09/008,762 filed Jan. 19, 1998 by Om P. Agrawal et al. and originally entitled, "SYNTHESIS-FRIENDLY FPGA ARCHITECTURE WITH VARIABLE LENGTH AND VARIABLE TIMING INTERCONNECT";

(H) Ser. No. 08/996,049 filed Dec. 22, 1997 by Om P. Agrawal et al. and originally entitled, "DUAL PORT SRAM MEMORY FOR RUN-TIME USE IN FPGA INTEGRATED CIRCUITS"; and (I) Ser. No. 09/208,203 filed Dec. 9, 1998 by Bai Nguyen et al. and originally entitled, "EFFICIENT INTERCONNECT NETWORK FOR USE IN FPGA DEVICE HAVING VARIABLE GRAIN ARCHITECTURE".

2b. Cross Reference to Related Patents

The following U.S. patent(s) are related to the present application and their disclosures are incorporated herein by reference:

(A) U.S. Pat. No. 5,212,652 issued May 18, 1993 to Om Agrawal et al, (filed as Ser. No. 07/394,221 on Aug. 15, 1989) and entitled, PROGRAMMABLE GATE ARRAY WITH IMPROVED INTERCONNECT STRUCTURE;

(B) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (C) U.S. Pat. No. 5,185,706 issued Feb. 9, 1993 to Om Agrawal et al.

3. Description of the Related Art

As density within integrated circuits (IC's) of digital logic circuitry increases, and as signal processing speed of such logic also increases, the ability to couple respective signals to an appropriate kinds of interconnect resource becomes more difficult.

Artisans have begun to recognize that conductors of different lengths and orientations should be provided in combination with different, line-driving amplifiers for servicing different kinds of signals in programmable logic arrays. By way of example, a first class of relatively long and relatively low-resistance conductors are included with high-powered, tristate line-drivers for broadcasting common control signals (e.g., clock, clock enable, etc.) over relatively large distances of the IC device with minimal skew. Such special conductors are sometimes referred to as tristatable, low-skew longlines.

As a further example, some wire segments are dedicated for transmitting logic input and logic output signals between immediately adjacent logic sections without routing through general switch matrices. These dedicated conductors are sometimes referred to as direct-connect lines and their correspondingly adapted line-drivers are sometimes referred to as direct-connect drivers.

At the same time that specialized conductors and line-drivers are provided, artisans strive to continue to provide field programmable logic arrays with general-purpose conductors, general-purpose routing switches and general-purpose line-drivers for carrying out general-purpose, sourcing and programmable routing of signals.

With all different kinds of conductors and line-drivers competing for space within an IC, the numbers of drivers and conductors for each kind of specialized interconnect resource (e.g., longlines) at each location can become a relatively limited resource. Every signal within a complex design cannot be allowed to have its own dedicated interconnect line and line-driver. If it were otherwise, the limited interconnect resources of the field-programmable array device would soon be exhausted. Fortunately, many designs allow for the transmission of plural signals at different times over a shared interconnect line. Such sharing may come in the form of time-domain multiplexing or burst-mode operations.

A number of different circuit techniques have been developed for allowing multiple signals to share a same interconnect line. Multiple tristate drivers may be used for example, with each tristate driver becoming a line master at a different time while the other tristate drivers of the same line go into a high-impedance output mode. The line-driving signal of that moment then passes without contention onto the shared line through its line-mastering, tristate (three state) driver.

In an alternative approach, a shared wire is urged towards a predefined logic state by means of a pull-up or pull-down resistor. An open-drain technology is then used to implement a wired-OR circuit on the urged line. Sharing signals OR into the shared line at different times. If desired, a logical ORring of simultaneous signals may be carried out on the so-driven line.

A third approach provides a dedicated multiplexer for driving the shared line. At each given time, an appropriately desired signal is selected by the dedicated multiplexer for output onto the shared line.

Each of these approaches has benefits and drawbacks. Tristate drivers tend to consume more circuit area than two-state drivers. They also generally need specialized control circuits for controlling their output-enable (OE) terminals so that contention and crowbar currents will be avoided. On the other hand, chip-internal tristate buses may be made extensible with off-chip tristate buses.

Wired-OR circuits have the drawback of tending to consume more power than purely CMOS circuits. Dedicated multiplexers are wasteful if it happens that their full selection capabilities are not utilized in a given design implementation. Also, signals on directly-multiplexed buses (without tristate capability) cannot be easily exchanged between off-chip and chip-internal circuits.

SUMMARY OF THE INVENTION

An improved resource-sharing scheme in accordance with the invention allows individual ones of tristate line-drivers to be shared by multiple, signal sourcing components of a Variable Grain Architecture (VGA) device. Shared line-driver resources within so-called Super Variable Grain Blocks (SVGB's) may be programmably-configured to allow multiple sources to drive them at different times.

Other aspects of the invention will become apparent from the below detailed description.

BRIEF DESCRIPTION OF THE DRAWINGS

The below detailed description makes reference to the accompanying drawings, in which:

FIG. 4B is a matrix showing input and control connections for one plurality of circuits such as shown in FIG. 4A;

DETAILED DESCRIPTION

Figure 1A:
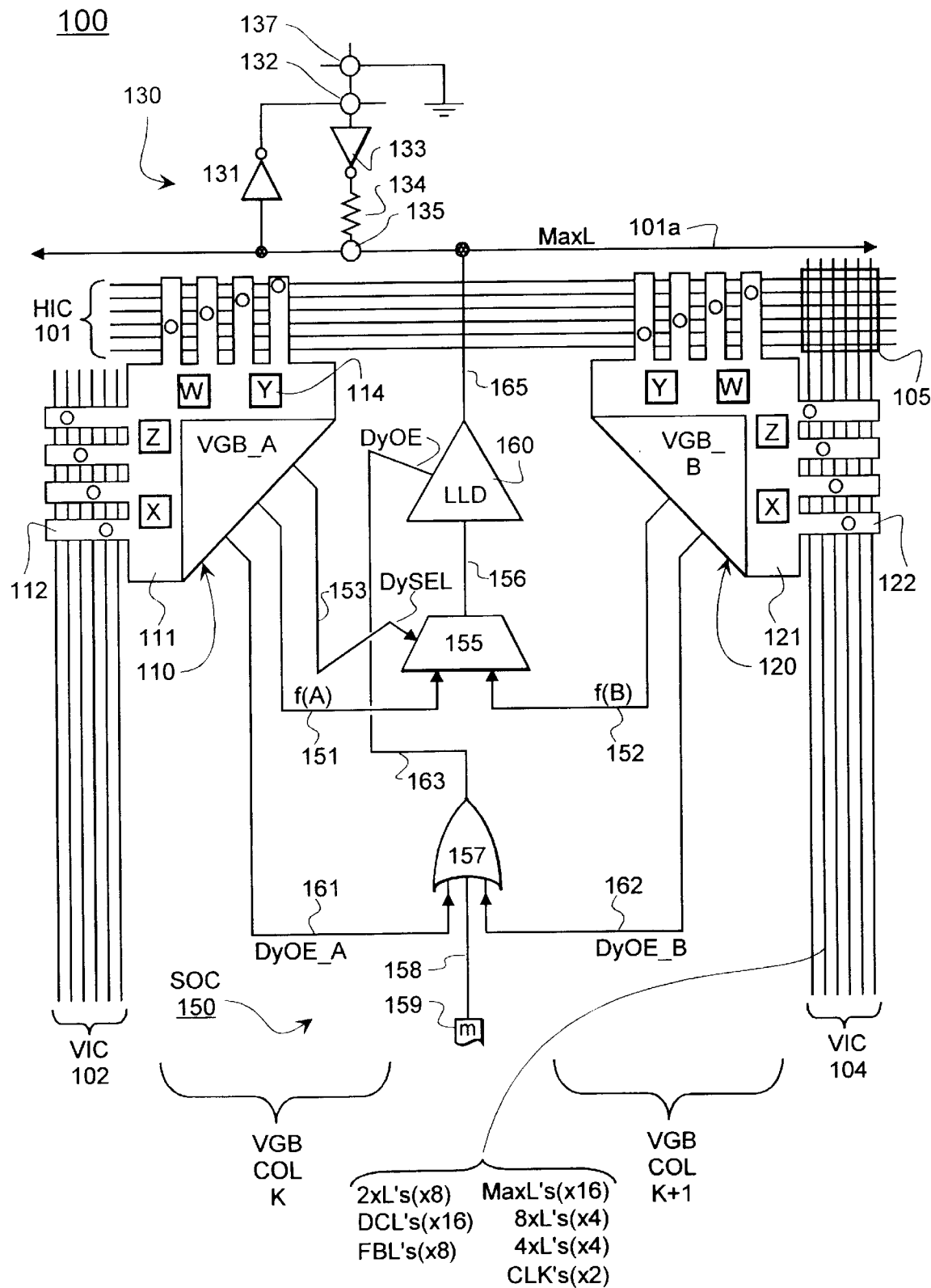
FIG. 1A provides a schematic diagram for explaining how a longline driver may be shared by two variable grain blocks (VGB's)

FIG. 1A provides a schematic diagram of a portion 100 of an FPGA integrated circuit (IC) device in accordance with the invention. IC portion 100 includes a horizontally-extending interconnect channel (HIC) 101, a vertically-extending, first interconnect channel (VIC) 102 and a vertically-extending, second interconnect channel (VIC) 104. A first switchboxes area (not shown) is provided at the intersection of HIC 101 and VIC 102. A second switchboxes area 105 is provided at the intersection of HIC 101 and VIC 104. Each switchboxes area (e.g., 105) includes a plurality of programmably-configurable switchboxes for selectively routing signals through the switchboxes area. Signals may continue along the same linear direction in which they enter the switchboxes area. Signals may also be routed so as to continue in an orthogonal direction along a conductor within a correspondingly orthogonal interconnect channel. The second switchboxes area 105 is mirror-symmetrical with the first switchboxes area (not shown).

Each of HIC 101 and VIC's 102, 104 includes a same set of diversified interconnect conductors. In one embodiment these diversified conductors include eight, VGB intra-connecting feedback lines (FBL's), 16 direct connect lines (DCL's), eight double-length conductors (2xL's), four quad-length conductors (4xL's), four octal-length conductors (8xL's) and 16 maximum-length conductors (MaxL's). Although not shown, each of HIC 101 and VIC's 102, 104 further includes two dedicated clock lines of maximum length.

Full explanations of uses for each of the diversified interconnect conductors mentioned here (FBL's through MaxL's) may be found in at least one of the above-cited patent applications. In brief, 2xL conductors each extend continuously and linearly for a distance of two variable grain structures known as VGB's. Element 110 is one such structure (VGB_A). Item 120 is another such structure (VGB_B). VGB_A and VGB_B belong to an array of such structures. See FIG. 2.

Each 4xL conductor extends continuously and linearly alongside four successive VGB's. Most 8xL conductors each extend continuously and linearly along eight VGB's. Each MaxL line extends linearly for a maximum distance within the array. Such MaxL lines are also referred to as longlines. Each DCL is a non-linear continuum of conductor that is dedicated for broadcasting a signal from a correspondingly dedicated, source VGB to a small cluster of neighboring VGB's. Each FBL is a non-linear conductor continuum that extends about a respective VGB for providing high-speed intra-connections within the VGB proper.

Each VGB (variable grain block) is provided adjacent to at least one HIC or VIC. In one embodiment, four VGB's are wedged together to define respective and mirror-symmetrical four corners of a super-VBG structure (SVGB). See FIG. 2. Each VGB in this SVGB structure is disposed adjacent to one HIC and one VIC of four interconnect channels that surround the SVGB structure in mirror-symmetrical fashion. The SVGB's are arranged as columns and rows. The HIC's and VIC's are also arranged as parallel columns and rows running along the columns and rows of SVGB's.

Figure 2B:
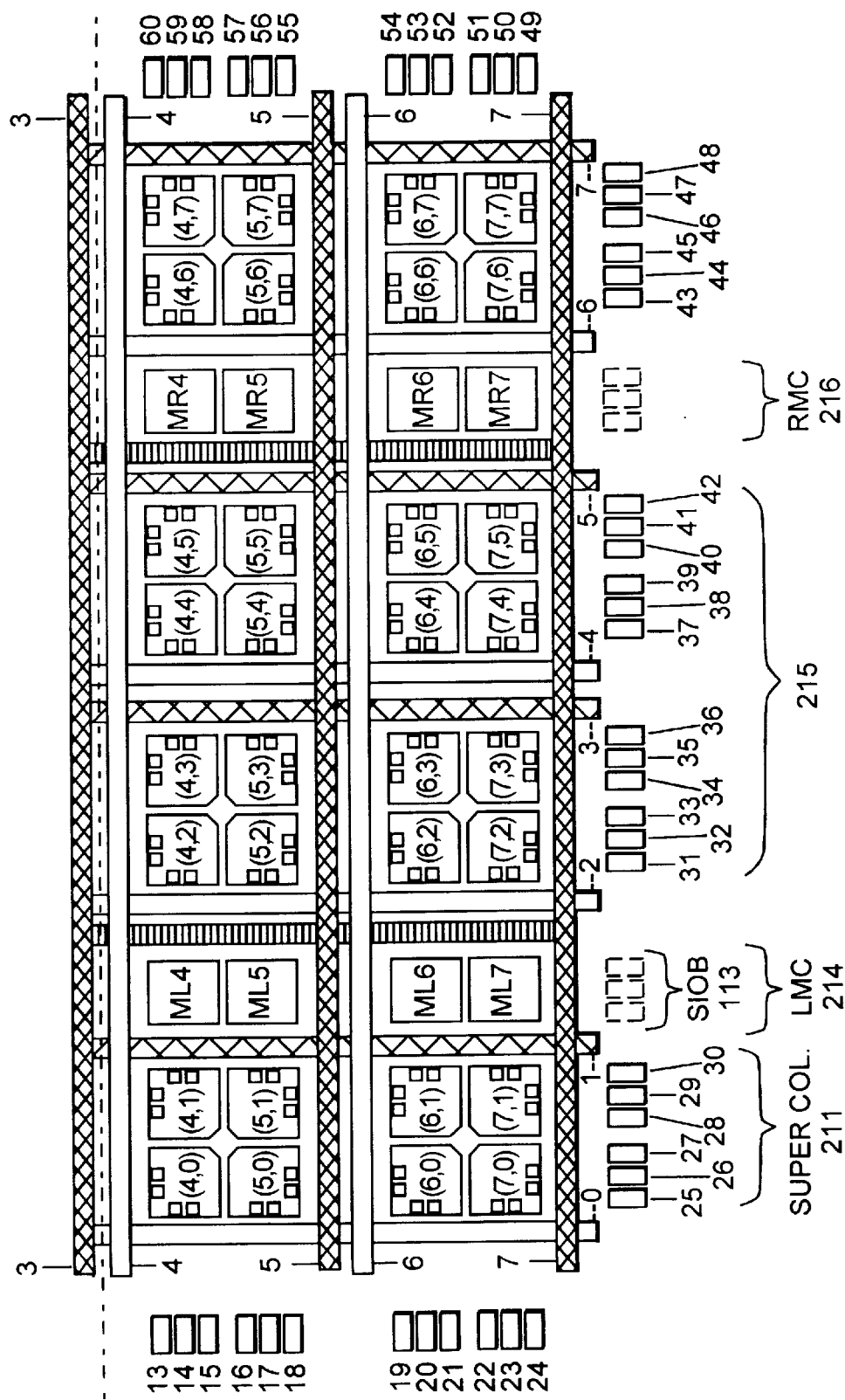
FIG. 2 illustrates an IC device in accordance with the invention having a matrix of SVGB structures, surrounding interconnect channels, and also embedded memory columns.

FIG. 1A shows a first exemplary VGB 110 disposed within a given VGB column K and a second exemplary VGB 120 disposed within a given VGB column K+1. There are two VGB columns (K and K+1) within each SVGB column. Two mirror-symmetrical VIC's 102, 104 brace each SVGB column. FIG. 2 shows a layout at a macroscopic level wherein 211 defines a SVGB column braced by VIC's 0 and 1. More will be said about FIG. 2 below.

Referring still to the more microscopic view of FIG. 1A, a signal acquisition layer 111 of VGB 110 has finger structures such as 112 extending orthogonally over the adjacent interconnect channels, HIC 101 and VIC 102 for acquiring signals from a statically-selected subset of the wires in neighboring HIC and VIC.

The term 'static selection' as used herein refers to selection processes that occurs during a configuring phase of usage of the FPGA device 100. In the configuring phase, configuration memory is programmed to define interconnect routings and logic fuctions in LUT's (look up tables). When the FPGA device is later used during run-time, statically-made selections such as signal routings cannot be quickly altered. In contrast, 'dynamic selections' can be freely and quickly altered during run-time.

From the view point of VGB 110, each of the individual conductors of the adjacent HIC 101 may be referred to as a Horizontal Adjacent Interconnect Line or 'HAIL'. Some of these HAIL's may extend continuously to other SVGB's (not shown) while others may terminate in the nearby switchboxes area 105. Similarly, each of the individual conductors of the adjacent VIC 102 may be referred to as a Vertical Adjacent Interconnect Line or 'VAIL'. Some of these VAIL's may extend continuously to other SVGB's (not shown) while others may terminate in a nearby switchboxes area.

The acquisition layer 111 of VGB 110 provides input interfacing with its HAIL's and VAIL's. Fingers such as 112 of this acquisition layer each represent one of a limited plurality of static multiplexers that may be configured during configuration-time. The static multiplexers may be used to select from the many diversified HAIL's and VAIL's (56 lines in each channel in the illustrated example), a subset of such conductors from which signals will be supplied to VGB_A 110.

Similarly, the acquisition layer 121 of VGB 120 (VGB_B) provides input interfacing with its HAIL's and VAIL's. Fingers such as 122 of this acquisition layer each represent one of a limited plurality of static multiplexers that may be configured during configuration-time. The static multiplexers may be used to select from the many diversified HAIL's and VAIL's of VGB_B, a subset of such conductors from which signals will be supplied to VGB_B 120.

For purposes of example, open circles are used in FIG. 1A to provide an indication of which HAIL is statically-selected by each of the acquisition fingers. Each such finger is shown having a corresponding and overlapping open circle within it at the position of its selected HAIL or VAIL. Such internally-hollow circles are also used to represent programmable interconnect points (PIP's). The illustrated open circles within the acquisition fingers of regions 111, 121 may be thought of as the specific PIP's that have been activated for connecting to a specific HAIL or VAIL. The identifiacations of unique connections to HAIL's or VAIL's in FIG. 1A do not correspond with the identification of lines at the bottom of FIG. 1A as being of different types (2xL, 4xL, etc.). Illustrative liberty was taken to specify two different concepts with the same schematic symbols.

There are a limited number, m, of acquisition fingers (112, 122) of each VGB that cross with a given interconnect channel. In one embodiment, the integer m is at least six but substantially less than the number of HAIL's or VAIL's in the adjacent interconnect channel 101, 102, 104. In one embodiment that has 56 AIL's in each adjacent interconnect channel, each VGB has sixteen fingers crossing with each of its adjacent interconnect channels (8 fingers per CBB). Thus the limited number of m fingers operate to statically bring into the VGB proper (110, 120) a subset of m signals from the greater than m number of adjacent signals in the adjacent channel so that the acquired m signals may be further processed within the VGB 110, 120.

Each VGB contains a set of primitive building blocks known as Configurable Building Elements (CBE's). Each CBE has at least one, statically-configurable lookup table (LUT) with at least 3 address-input terminals. Pairs of CBE's may be synthetically-combined or folded-together to define a higher level building block known as a CBB (Configurable Building Block). In FIG. 1A, element 114 represents one such CBB. See also element 204 of FIG. 2. In one embodiment, there are four CBB's per VGB, respectively named X, Z, W, and Y. Details concerning the folding-together operations of CBE's and concerning the structures of CBB's may be be found in at least one of the above-cited patent applications.

Pairs of CBB's may be further combined or folded together to define a yet-higher level building block known as a CBB-duet. In one embodiment, the largest building structure allowed within each VBG is a combination of two CBB-duets to form a CBB-quartet. It is, of course, within the contemplation of the present invention to allow for yet larger combinations of foldings within each VGB if the VGB has more CBB's.

It is therefore seen from the above that each VGB (e.g., 110, 120) can function both as a signal acquiring resource by virtue of its acquisition fingers 112, 122 and also as a signal processing resource or set of signal processing resources by virtue of its granularly-combinable primitives (CBE's (not shown) and CBB's such as 114).

Output signals of each VGB may be routed through a variety of different output mechanisms (not all shown) for application to different kinds of HAIL's, and VAIL's including, in each channel: a 2xL line, a 4xL line, a 8xL line, a direct connect line (DCL), and a feedback line (FBL). One of the output mechanisms is shown at 150 and is referred to herein as a shared output component (SOC). SOC 150 includes a dynamic multiplexer 155 having data inputs 151, 152 and an output 156. Dynamic multiplexer (DyMUX) 155 also has a dynamically-controllable select terminal 153 for dynamically selecting an data input signal on one of inputs 151, 152 for output on terminal 156.

The shared output component (SOC) 150 further includes an OR gate 157 having three data inputs, 158, 161 and 162; and an output 163. OR input terminal 158 is driven by configuration memory cell 159. Input terminal 161 is driven by VGB_A (110). Input terminal 162 is driven by VGB_B (120). OR output 163 drives a dynamically-controllable output-enable (DyOE) terminal of a longline-driving tristate buffer 160. This longline driver (LLD) 160 is yet another part of SOC 150. Output terminal 165 of LLD 160 couples to a MaxL line 101a. This MaxL line 101a is part of HIC 101 and crosses with the acquisition fingers of VGB_A and VGB_B just as do other conductors of HIC 101. However, for purposes of illustrative emphasis, MaxL line 101a is drawn spaced away from the remainder of HIC 101.

In one embodiment, a state-keeper circuit 130 connects to MaxL line 101a. The state-keeper circuit 130 includes first inverter 131, second inverter 133 and resistive element 134. Elements 131, 133 and 134 are programmably-couplable to form a weak latch whose state can be overriden by the output of longline driver (LLD) 160. Resistive element 134 may be an integral part of second inverter 133, the former being implemented by using narrow-channel transistors in the latter. The state-keeper circuit 130 further includes PIP's 132, 135 and 137. The weak latch is programmably-defined by activating PIP's 132 and 135 while leaving PIP 137 in the open state. If PIP 137 is instead activated into the closed state together with PIP 135 while PIP 132 is left open, the input of second inverter 133 becomes grounded so as to cause resistive element 134 to weakly urge MaxL line 101*a* high. This logic '1' state may of course, be overriden by the output of longline driver (LLD) 160. If PIP 135 is left open, the state-keeper circuit 130 has no essentially effect on the state of MaxL line 101*a*.

State-keeper circuit 130 may be used to maintain a pre-defined logic state on MaxL line 101*a* during times when DyOE line 163 is deactivated (not enabling tristate buffer 160) and no other tristate buffer is otherwise driving MaxL line 101*a*.

VGB_A (110) can output a dynamically-changing first signal, DyOE_A onto the first OR input terminal 161. VGB_B (120) can output a dynamically-changing second signal, DyOE_B onto the second OR input terminal 162. A logic '1' state on any of OR input terminals, 161, 162 and 158 will of course activate DyOE line 163 and cause LLD 160 to transmit the signal of line 156 onto MaxL line 101*a*.

VGB_A (110) can output a dynamically-changing third signal, DySEL onto the select-controlling terminal 153 of DyMUX 155. The DySEL signal is derived from control signals acquired by VGB_A from its surrounding AIL's (adjacent interconnect lines) by way of its acquisition fingers (112).

VGB_A (110) can also output a dynamically-changing fourth signal, f(A) onto the first input terminal 151 of DyMUX 155. The f (A) signal is derived from input-term signals acquired by VGB_A from its surrounding AIL's (adjacent interconnect lines) by way of its acquisition fingers (112). Typically, the f(A) signal is also derived by post-acquisition processing within VGB_A of the acquired input-term signals, where the processing is carried out by any one or more of the CBE (not shown), CBB (114), or other granulatable logic resources of VGB_A. The f(A) signal may also be a feed-through signal that is simply acquired by VGB_A and then fed through to SOC 150 without transformation. Details concerning the generation of the f(A) signal as a function of n acquired, input term signals (e.g., f(A)=f(1T), or f(3T), or . . . f(16T)) may be be found in at least one of the above-cited patent applications.

Similar to the generation by VGB_A of the f(A) signal, VGB_B (120) can output a dynamically-changing fifth signal, f(B) onto the second input terminal 152 of DyMUX 155. The f(B) signal is derived from input-term signals acquired by VGB_B from its surrounding AIL's by way of its acquisition fingers (122). As is the case with f(A), the f(B) signal is typically derived by post-acquisition transformation within VGB_B of its acquired input-term signals, where the transformation or processing is carried out by any one or more of the CBE (not shown), CBB (X, Z, W, and Y), or other granulatable logic resources of VGB_B. The f(B) signal may also be a feed-through signal that is simply acquired by VGB_B and then fed through to SOC 150 without transformation.

In FPGA device 100, the DySEL signal 153 can dynamically select one of the f(A) and f(B) signals for output onto line 156 at a desired time. Either of VGB_A 110 or VGB_B 120 can force the DyOE signal 163 to become active (logic '1') by rasserting its respective DyOE_A(161) or DyOE_B (162) signal. When DyOE signal 163 is activated, the then selected one of the f(A) and f(B) signals is output by LLD 160 onto MaxL line 101*a*.

Thus, it is seen that VGB_A 110 and VGB_B 120 can share the resources defined by SOC 150 and MaxL line 101*a* on a time-multiplexed basis. One or more HAIL's (not specifically shown) within HIC 101 may provide coordinating control signals for determining when each of VGB_A 110 and VGB_B 120 has access through DyMUX 155. One or more HAIL's within HIC 101 or VAIL's within VIC 102 may provide coordinating control signals for determining when the DyOE signal 163 should be asserted. (Configuration memory bit 159 is of course assumed to be held at logic '0' for this situation.)

Conversely, VGB_A 110 may exclusive control of SOC 150 for itself by use of the DySEL signal 153. Alternatively, VGB_A 110 may grant exclusive control of SOC 150 to VGB_B 120, again by appropriate seeting of the DySEL signal 153.

Figure 1B:
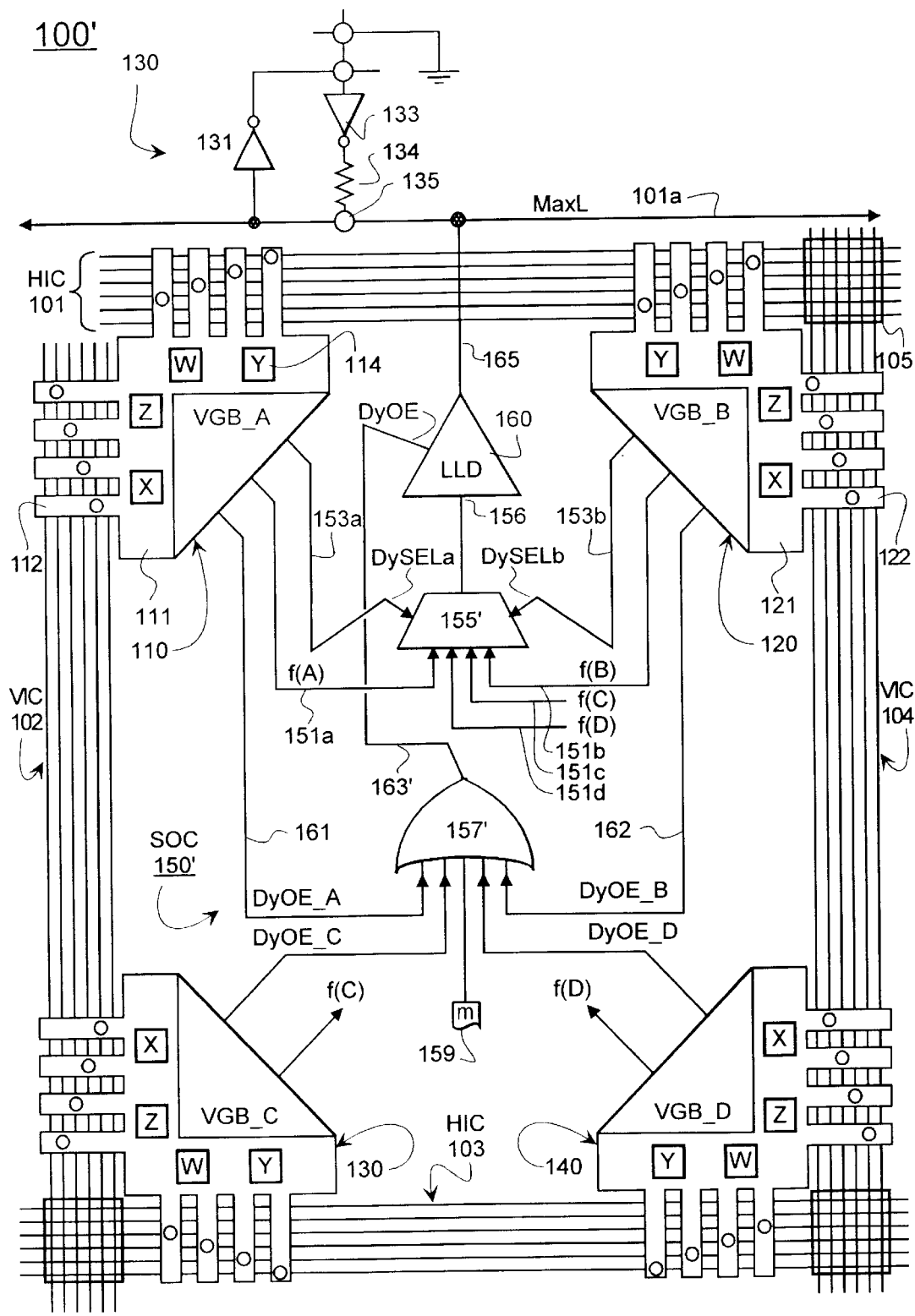
FIG. 1B provides a schematic diagram for explaining how a longline driver may be shared by four VGB'S.

FIG. 1B shows the concept as taken to a next higher level. Where practical, like reference numerals and symbols are used corresponding to those of FIG. 1A. As such a repeat of all is not necessary here. HIC 103 is shown at the bottom of FIG. 1B crossing with VIC's 102 and 104. Switchbox areas like area 105 are shown at the intersections. VGB_C (130) is shown disposed near the intersection of VIC 102 and HIC 103. VGB_D (140) is shown disposed near the intersection of VIC 104 and HIC 103. VGB's 110, 120, 130 and 140 are mirror symmetrical with respect to each other and define parts of an SVGB structure that has SOC 150' disposed near its middle.

In the embodiment 100' of FIG. 1B, DyMUX 155' has four input terminals respectively denoted as 151*a* through 151*d* for respectively receiving signals f(A), f(B), f(C) and f(D). Signals f(A), f(B), f(C) and f(D) are respectively supplied from VGB_A (110), VGB_B (120), VGB_C (130), and VGB_D (140).

The 4-to-1 DyMUX 155' has two, dynamically-controllable select terminals, 153*a* and 153*b*, respectively receiving two selection signals, DySELa and DySELb, from respective VGB's 110 and 120. When DySELb is at logic '0', DySELa controls the choice as between f(A) and another of the three remaining f() signals, for example, f(C). When DySELa is at logic '0', DySELb controls the choice as between f(B) and another of the three remaining f() signals, for example, f(D).

OR gate 157' has at least four inputs respectively receiving dynamic output-enable signals, DyOE_A, DyOE_B, DyOE_C, and DyOE_D from respective VGB's 110, 120, 130 and 140. A fifth input of OR gate 157' may be included for receiving the output of configuration memory cell 159.

Thus, it is seen that VGB_A (110), VGB_B (120), VGB_C (130), and VGB_D (140) can share the resources defined by SOC 150' and MaxL line 101*a* on a time-multiplexed basis. One or more HAIL's (not specifically shown) within HIC 101 may provide coordinating control signals for determining when, as between VGB_A 110 and VGB_B 120, each of these VGB's has access through DyMUX 155'. One or more HAIL's (not specifically shown) within HIC 103 may provide coordinating control signals for determining when, as between VGB_C 130 and VGB_D 140, each of these VGB's has access through DyMUX 155'. One or more VAIL's (not specifically shown) within either of VIC's 102 and 104 may provide coordinating control signals for determining when, as between the first group of VGB_A–VGB_B (110–120) and the second group of VGB_C–VGB_D (130–140), each of these VGB groups has access through DyMUX 155'.

One or more HAIL's or VAIL's within HIC's 101, 103 and VIC's 102, 104 may provide coordinating control signals for determining when the DyOE signal 163' should be asserted. (Configuration memory bit 159 is of course assumed to be held at logic '0' for this situation.)

Conversely, VGB_A 110 may take exclusive control of SOC 150' for itself if VGB_B 120 sets DySELb to '0' by VGB_A making use of the DySELa signal 153a. Alternatively, VGB_A 110 may grant exclusive control of SOC 150' to VGB_B 120, again by appropriate setting of the DySELa signal 153a to '0'.

FIG. 2 shows a macroscopic view of an FPGA device 200 in accordance with the invention. The illustrated structure is preferably formed as a monolithic integrated circuit.

The macroscopic view of FIG. 2 is to be understood as being taken at a magnification level that is lower than otherwise-provided, microscopic views. The more microscopic views may reveal greater levels of detail which may not be seen in more macroscopic views. And in counter to that, the more macroscopic views may reveal gross architectural features which may not be seen in more microscopic views. It is to be understood that for each more macroscopic view, there can be many alternate microscopic views and that the illustration herein of a sample microscopic view does not limit the possible embodiments of the macroscopically viewed entity.

FPGA device 200 includes a regular matrix of super structures defined herein as super-VGB's (SVGB's). In the illustrated embodiment, a dashed box (upper left corner) circumscribes one such super-VGB structure which is referenced as 201. There are four super-VGB's shown in each super row of FIG. 2 and also four super-VGB's shown in each super column. Each super row or column contains plural rows or columns of VGB's. One super column is identified as an example by the braces at 211. Larger matrices with more super-VGB's per super column and/or super row are of course contemplated. FIG. 2 is merely an example.

As should be apparent from the above discussion, there is a hierarchy of user-configurable resources within each super-VGB. At a next lower level, each super-VGB is seen to contain four VGB's. In the illustrated embodiment, identifier 202 points to one such VGB within SVGB 201.

A VGB is a Variable Grain Block that includes its own hierarchy of user configurable resources. At a next lower level, each VGB is seen to contain four Configurable Building Blocks or CBB's arranged in a L-shaped configuration. In the illustrated embodiment, identifier 204 points to one such CBB within VGB 202.

At a next lower level, each CBB (204) has its own hierarchy of user configurable resources. A more detailed description of the hierarchal resources of the super-VGB's, VGB's, CBB's, and so forth, may be found in the above-cited Ser. No. 08/948,306 filed Oct. 9, 1997 by Om P. Agrawal et al. and originally entitled, "VARIABLE GRAIN ARCHITECTURE FOR FPGA INTEGRATED CIRCUITS", whose disclosure is incorporated herein by reference.

It is sufficient for the present to appreciate that each CBB (204) is capable of producing and storing at least one bit of result data and/or of outputting the result data to adjacent interconnect lines. Each VGB (202) is in turn, therefore capable of producing and outputting at least 4 such result bits at a time to adjacent interconnect lines. This is referred to as nibble-wide processing. Nibble-wide processing may also be carried out by the four CBB's that line the side of each SVGB (e.g., 201).

With respect to the adjacent interconnect lines (AIL's), each SVGB is bounded by two horizontal and two vertical interconnect channels (HIC's and VIC's). An example of a HIC is shown at 250. A sample VIC is shown at 260. Each such interconnect channel contains a diverse set of interconnect lines (e.g., 2xL's-MaxL's) as has already been explained.

The combination of each SVGB (e.g., 201) and its surrounding interconnect resources (of which resources, not all are shown in FIG. 2) is referred to as a matrix tile. Matrix tiles are tiled one to the next as seen, with an exception occurring about the vertical sides of the two central, super columns, 215. Columns 214 (LMC) and 216 (RMC) of embedded memory are provided along the vertical sides of the central pair 215 of super columns. These columns 214, 216 will be examined in closer detail shortly.

From a more generalized perspective, the tiling of the plural tiles creates pairs of adjacent interconnect channels within the core of the device 200. An example of a pair of adjacent interconnect channels is seen at HIC's 1 and 2. The peripheral channels (HIC0, HIC7, VIC0, VIC7) are not so paired. Switch matrix boxes (not shown, see 105 of FIG. 1A) are formed at the intersections at the respective vertical and horizontal interconnect channels. The switch matrix boxes form part of each matrix tile construct that includes a super-VGB at its center.

The left memory column (LMC) 214 is embedded as shown to the left of central columns pair 215. The right memory column (RMC) 216 is further embedded as shown to the right of the central columns pair 215. It is contemplated to have alternate embodiments with greater numbers of such embedded memory columns symmetrically distributed in the FPGA device and connected in accordance with the teachings provided herein for the illustrated pair of columns, 214 and 216.

Within the illustrated LMC 214, a first, special, vertical interconnect channel (SVIC) 264 is provided adjacent to respective, left memory blocks ML0 through ML7. Within the illustrated RMC 264, a second, special, vertical interconnect channel (SVIC) 266 is provided adjacent to respective, right memory blocks MR0 through MR7.

As seen, the memory blocks, ML0–ML7 and MR0–MR7 are numbered in accordance with the VGB row they sit in (or the HIC they are closest to) and are further designated as left or right (L or R) depending on whether they are respectively situated in LMC 214 or RMC 216. In one embodiment, each of memory blocks, ML0–ML7 and MR0–MR7 is organized to store and retrieve an addressable plurality of nibbles, where a nibble contains 4 data bits. More specifically, in one embodiment, each of memory blocks, ML0–ML7 and MR0–MR7 is organized as a group of 32 nibbles (32×4=128 bits) where each nibble is individually addressable by five address bits. The nibble-wise organization of the memory blocks, ML0–ML7 and MR0–MR7 corresponds to the nibble-wise organization of each VGB (202) and/or to the nibble-wise organization of each group of four CBB's that line the side of each SVGB (201). Thus, there is a data-width match between each embedded memory block and each group of four CBB's or VGB. A similar kind of data-width matching also occurs within the diversified resources of the general interconnect mesh. Each of memory blocks ML0–ML7 and MR0–MR7 can output a respective nibble of data onto lines within its immediately adjacent, HIC (e.g., 250).

At the periphery of the FPGA device 200, there are three input/output blocks (IOB's) for each row of VGB's and for each column of VGB's. One such IOB is denoted at 240. The IOB's in the illustrated embodiment are shown numbered from 1 to 96. In one embodiment, there are no IOB's directly above and below the LMC 214 and the RMC 216. In an alternate embodiment, special IOB's such as shown in phantom at 213 are provided at the end of each memory column for driving address and control signals into the corresponding memory column.

Each trio of regular IOB's at the left side (1–24) and the right side (49–72) of the illustrated device 200 may be user-configured to couple to the nearest HIC. Similarly, each trio of regular IOB's on the bottom side (25–48) and top side (73–96) may be user-configured for exchanging input and/or output signals with lines inside the nearest corresponding VIC. The SIOB's (e.g., 213), if present, may be user-configured to exchange signals with the nearest SVIC (e.g., 264). Irrespective of whether the SIOB's (e.g., 213) are present, data may be input and/or output from points external of the device 200 to/from the embedded memory columns 214, 216 by way of the left side IOB's (1–24) and the right side IOB's (49–72) using longline coupling. The longline coupling allows signals to move with essentially same speed and connectivity options from/to either of the left or right side IOB's (1–24, 49–72) respectively to/from either of the left or right side memory columns.

Data and/or address and/or control signals may also be generated within the FPGA device 200 by its internal VGB's and transmitted to the embedded memory 214, 216 by way of the HIC's and SVIC's 264/266.

The VGB's are numbered according to their column and row positions. Accordingly, VGB(0,0) is in the top left corner of the device 200; VGB(7,7) is in the bottom right corner of the device 200; and VGB(1,1) is in the bottom right corner of SVGB 201.

Each SVGB (201) may have centrally-shared resources. Such centrally-shared resources are represented in FIG. 2 by the diamond-shaped hollow at the center of each illustrated super-VGB (e.g., 201). Longline driving amplifiers (see 160 of FIGS. 1A–1B) correspond with these diamond-shaped hollows and have their respective outputs coupling vertically and horizontally to the adjacent HIC's and VIC's of their respective super-VGB's.

As indicated above, each super-VGB in FIG. 2 has four CBB's along each of its four sides. The four CBB's of each such interconnect-adjacent side of each super-VGB can store a corresponding four bits of result data internally so as to define a nibble of data for output onto the adjacent interconnect lines. At the same time, each VGB contains four CBB's of the L-shaped configuration which can acquire and process a nibble's worth of data. One of these processes is nibble-wide addition within each VGB. Another of these processes is implementation of a 4:1 dynamic multiplexer within each CBB. The presentation of CBB's in groups of same number (e.g., 4 per side of a super-VGB and 4 within each VGB) provides for a balanced handling of multi-bit data packets along rows and columns of the FPGA matrix. For example, nibbles may be processed in parallel by one column of CBB's and the results may be efficiently transferred in parallel to an adjacent column of CBB's for further processing. Such nibble-wide handling of data also applies to the embedded memory columns 214/216. Nibble-wide data may be transferred between one or more groups of four CBB's each to a corresponding one or more blocks of embedded memory (MLx or MRx) by way of sets of 4 equally-long lines in a nearby HIC. Each such set of 4 equally-long lines may be constituted by the double-length lines (2xL lines), quad-length lines (4xL lines), octal-length lines (8xL lines) or maximum length longlines (MaxL lines).

In one particular embodiment of the FPGA device, the basic matrix is 10-by-10 SVGB's, with embedded memory columns 214/216 positioned around the central two super columns 215. (See FIG. 2.) In that particular embodiment, the integrated circuit is formed on a semiconductor die having an area of about 120,000 mils$^2$ or less. The integrated circuit includes at least five metal layers for forming interconnect. So-called 'direct connect' lines and 'longlines' of the interconnect are preferably implemented entirely by the metal layers so as to provide for low resistance pathways and thus relatively small RC time constants on such interconnect lines. Logic-implementing transistors of the integrated circuit have channel lengths of 0.35 microns or 0.25 microns or less. Amplifier output transistors and transistors used for interfacing the device to external signals may be larger, however.

Figure 3A:
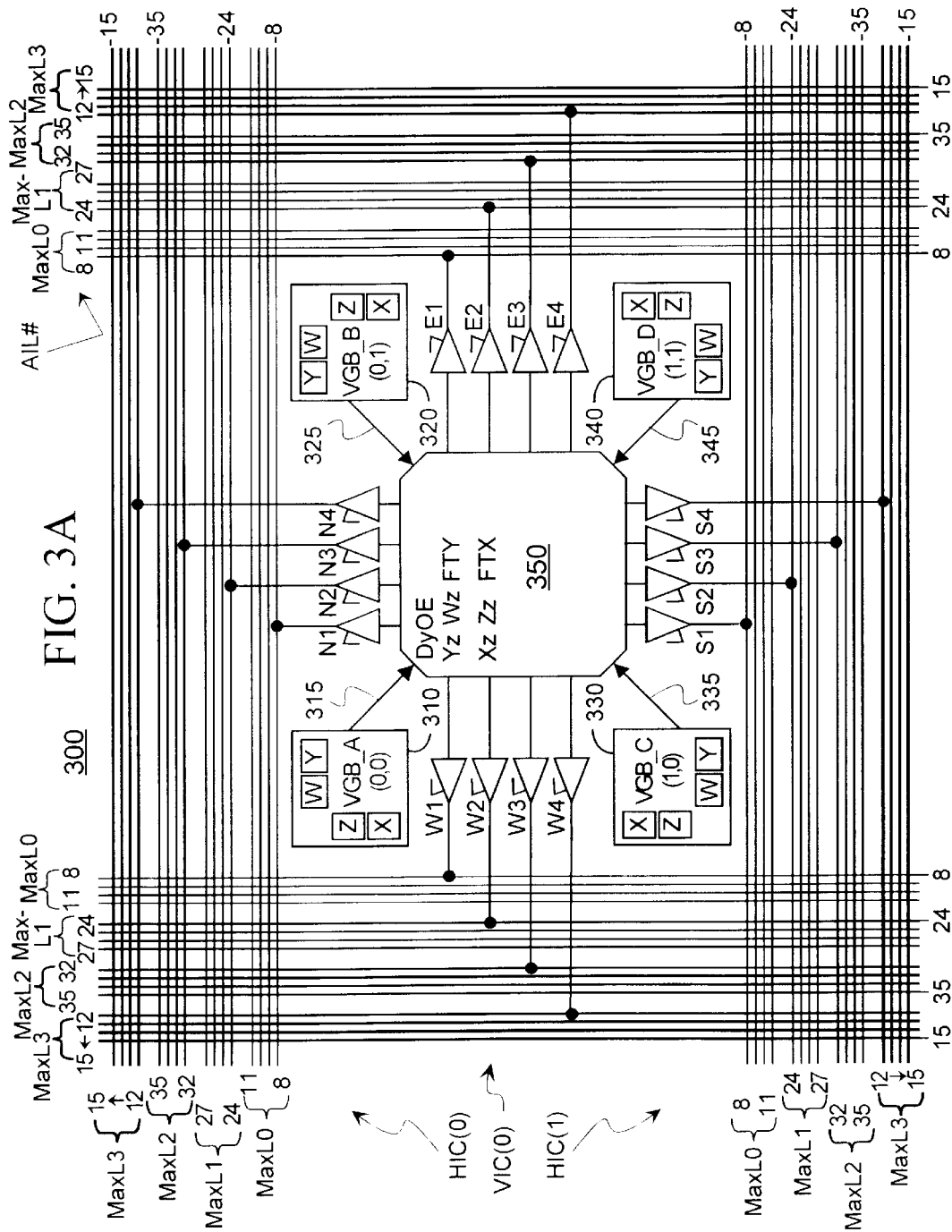
FIGS. 3A, 3B, 3C, 3D respectively are schematics of connections of the shared, big drives to adjacent interconnect lines for super-VGB's (0,0), (1,1), (2,2) and (3,3) of a matrix of such super-VGB's.

As indicated above, each VGB may contain nibble-wide drive capabilities. FIG. 3A shows one embodiment 300 wherein there are sixteen (16) shared big drivers (MaxL drivers) in the shared core of each SVGB for providing nibble-wide coupling to MaxL interconnect lines of each of the four respectively adjacent HIC's and VIC's. The connections shown in FIG. 3A are for the case of super-VGB (0,0) of embodiment 300. This super-VGB is surrounded by horizontal interconnect channels (HIC's) 0 and 1 and by vertical interconnect channels (VIC's) 0 and 1. The encompassed VGB's 310, 320, 330 and 340 are respectively enumerated as A=(0,0), B=(0,1), C=(1,0) and D=(1,1). The shared output components (SOC's) section of this SVGB is shown at 350. SOC's section 350 controls sixteen tristate-able longline-drivers (LLD's) that are respectively identified according to the channel they service as: N1 through N4, E1 through E4, S1 through S4, and W1 through W4. Angled line 315 represents the supplying of generically-identified signals: DyOE, Yz, Wz, Xz, Zz, FTY(1,2) and FTX(1,2) to SOC's section 350 from VGB_A (310). Thus it is seen that each of the Y, W, X, and Z CBB's of VGB_A can supply a respective function signal, Yz, Wz, Xz, and Zz for output by a tristate longline-driver. VGB_A also supplies a respective, dynamic output-enable signal, DyOE_A. VGB_A also supplies four respective feed-through signals, FTY(1), FTY(2), FTX(1) and FTX(2) from its acquisition fingers (not shown).

Angled lines 325, 335, and 345 similarly and respectively represent the supplying of the above generically-identified signals to block 350 from VGB_B, VGB_C and VGB_D.

The adjacent MaxL interconnect lines are subdivided in each HIC or VIC into four groups of 4 MaxL lines each. These groups are respectively named MaxL0, MaxL1, MaxL2 and MaxL3 as one moves radially out from the core of the super-VGB. AIL numbers are assigned to respective lines. MaxL drivers N1 through N4 respectively connect to the line that is closest to the core in each of respective groups MaxL0, MaxL1, MaxL2 and MaxL3 of the adjacent north HIC.

MaxL drivers E1 through E4 similarly and respectively connect to the closest to the core ones of MaxL lines in respective groups MaxL0–MaxL3 of the adjacent east VIC. MaxL drivers S1 through S4 similarly and respectively connect to the closest to the core ones of MaxL lines in respective groups MaxL0–MaxL3 of the adjacent south HIC. MaxL drivers W1 through W4 similarly and respectively connect to the closest to the core ones of MaxL lines in respective groups MaxL0–MaxL3 of the adjacent west vertical interconnect channel (VIC(0)).

As one steps right in the FPGA device 300 to a next super-VGB (not shown), the N1–N4 connections move up by one line in each of the respective groups MaxL0–MaxL3, until the move where the top most line is reached in each group. Then, in the next such move, the connections wrap around to the bottom most line for the next super-VGB to the right and the scheme repeats.

A similarly changing pattern applies for the southern drives. As one steps right to a next super-VGB (not shown), the S1–S4 connections move down by one line in each of the respective groups MaxL0–MaxL3, until the bottom most line is reached in each group, and then the connections wrap around to the top most line for the next super-VGB to the right and the scheme repeats.

A similarly changing pattern applies for the eastern and western drives. As one steps down to a next super-VGB (not shown), the E1–E4 and W1–W4 connections move outwardly by one line in each of the respective groups MaxL0–MaxL3, until the outer most line is reached in each group, and then the connections wrap around to the inner most line of each group for the next super-VGB down and the scheme repeats.

Figure 3B:
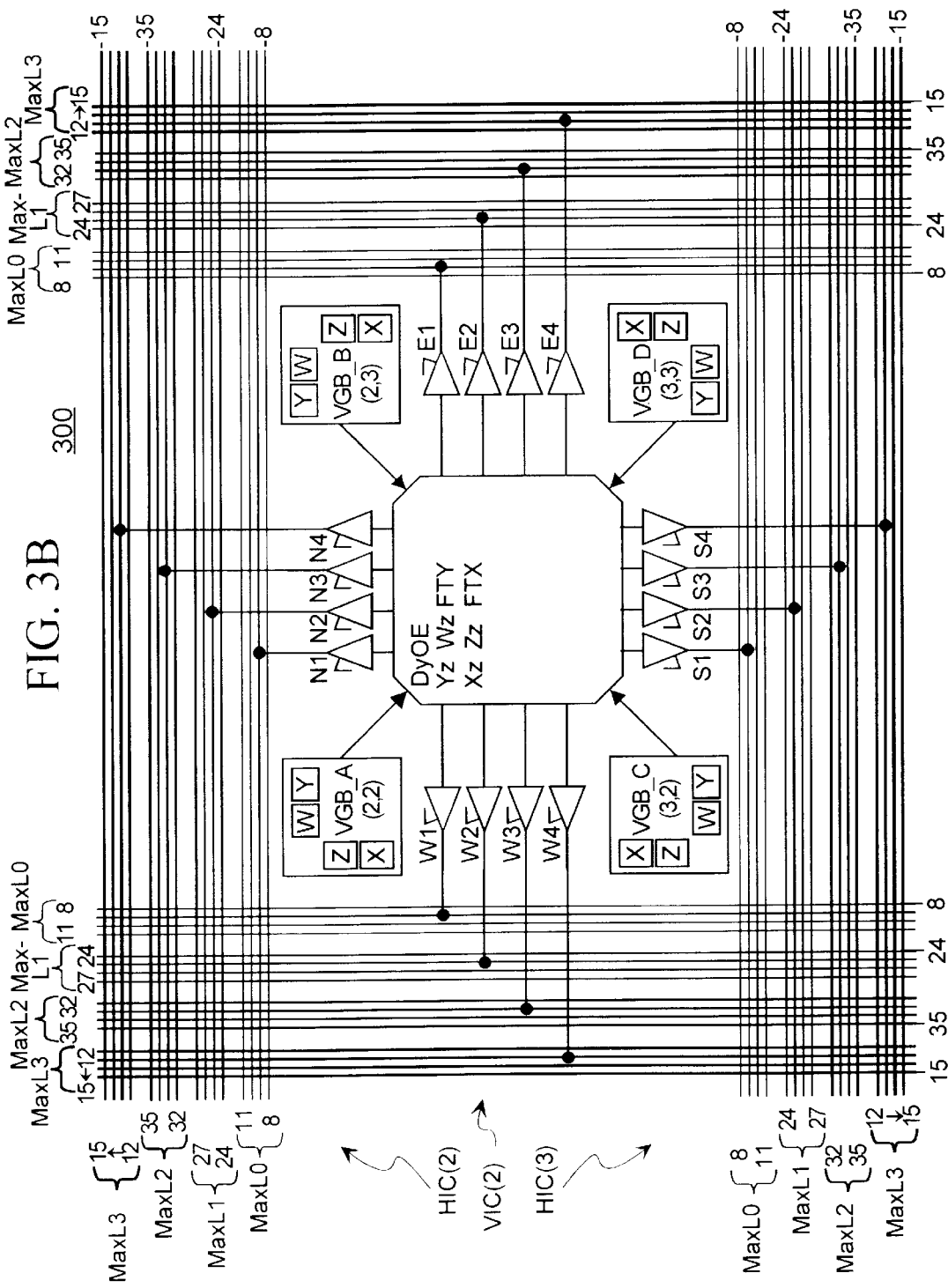

FIG. 3B shows a sampling of this out-stepping pattern of connections for the super-VGB surrounded by HIC's 2 and 3 and by VIC's 2 and 3. The encompassed VGB's are enumerated as A=(2,2), B=(2,3), C=(3,2) and D=(3,3).

Figure 3C:
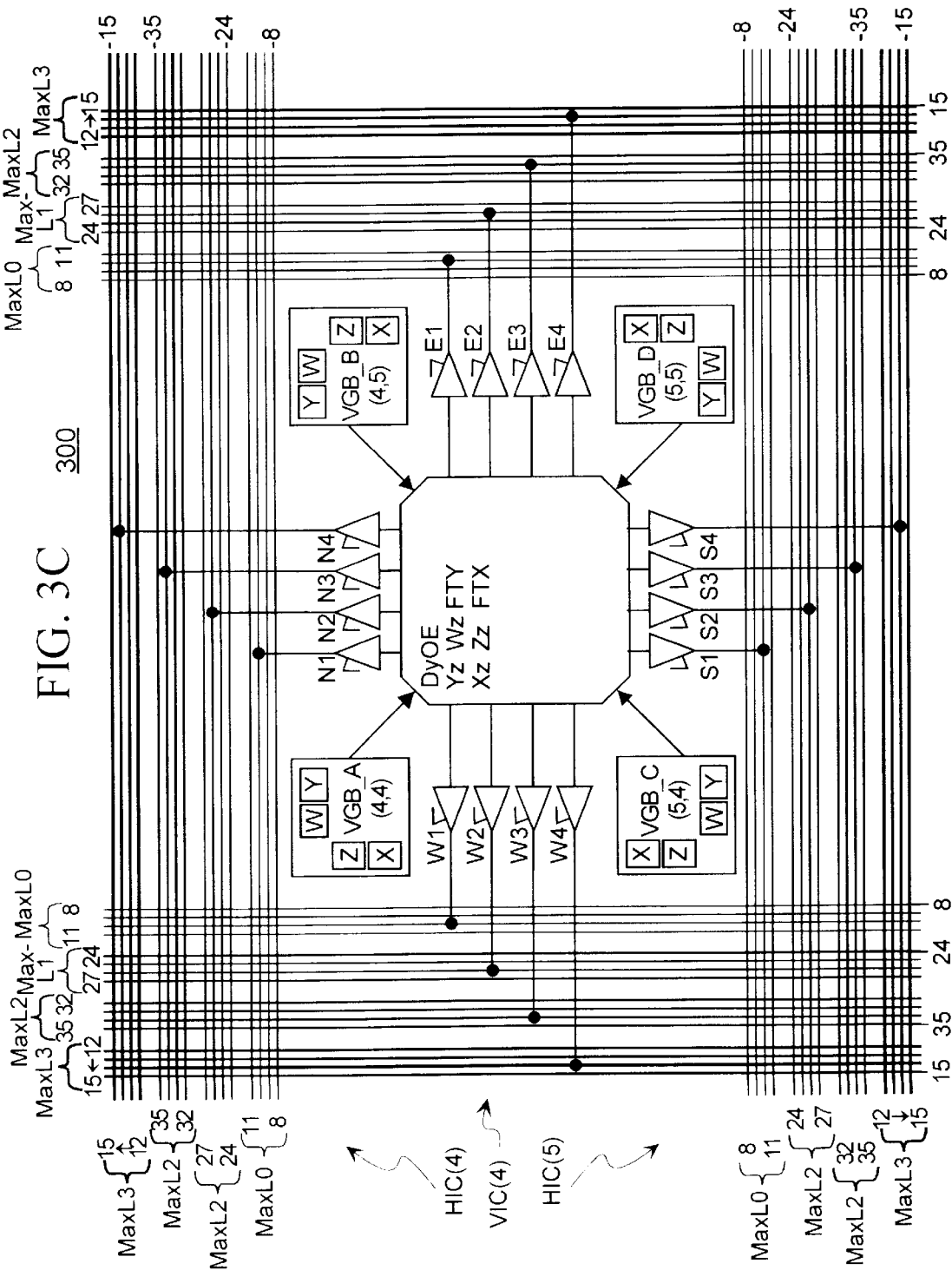

FIG. 3C shows a sampling of this out-stepping pattern of connections for the next super-VGB along the diagonal, which super-VGB is surrounded by HIC's 4 and 5 and by VIC's 4 and 5. The encompassed VGB's are enumerated as A=(4,4), B=(4,5), C=(5,4) and D=(5,5).

Figure 3D:
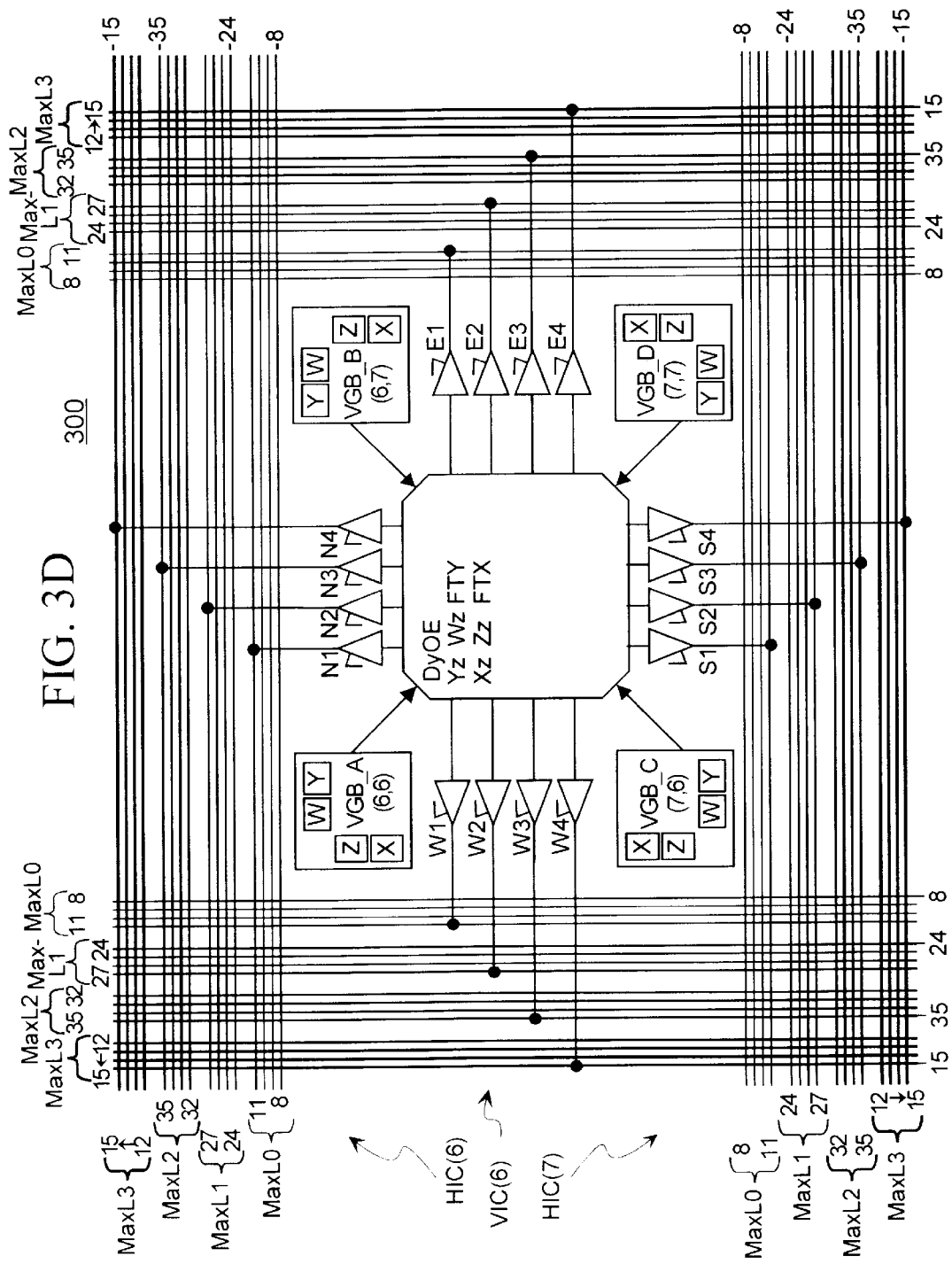

FIG. 3D shows a sampling of this out-stepping pattern of connections for the next super-VGB along the diagonal, which super-VGB is surrounded by HIC's 6 and 7 and by VIC's 6 and 7. The encompassed VGB's are enumerated as A=(6,6), B=(6,7), C=(7,6) and D=(7,7).

The combination of FIGS. 3A-3D demonstrates how all 16 MaxL lines of a given HIC can be driven by the northern or southern MaxL drivers of a horizontal succession of four super-VGB's. The combination of FIGS. 3A–3D also demonstrates how all 16 MaxL lines of a given VIC can be driven by the eastern or western MaxL drivers of a vertical succession of four super-VGB's. Bus-wide operations can be supported for nibble-wide buses by just one super-VGB acting as the bus driver. Bus-wide operations can be supported for byte-wide buses by a pair of super-VGB's acting as bus master. Bus-wide operations can be supported for 16 bit-wide buses by a quadruple of super-VGB's acting as bus master. For wider buses, the driving super-VGB's can be configured to behave as dynamic multiplexers that provide time-multiplexed sharing of the adjacent MaxL lines. For example, each of the X, Z, W, and/or Y CBB's of each longline-driving super-VGB can be configured as a 4:1 multiplexer. The CSE output signals Xz, Zz, Wz, and/or Yz of these CBB's can then drive the shared big drives to provide neighboring VGB's with time shared access to the driven longlines of the respective, longline-driving super-VGB.

In cases where it is desirable for both VGB_A and VGB_B to drive their respective 1 to 4 bits of output data (Xz, Zz, Wz, and/or Yz) through a same quartet of longline-drivers (N1, N2, N3, N4 for example), the configuration scheme of FIG. 1A may be used. In cases where it is desirable for three or more of VGB_A, VGB_B, VGB_C and VGB_D to drive their respective 1 to 4 bits of output data (Xz, Zz, Wz, and/or Yz) through a same quartet of longline-drivers (N1, N2, N3, N4 for example), the configuration scheme of FIG. 1B may be used.

Note that there is a same number (e.g., 16) of MaxL drivers as there are CBB's (X,Z,W,Y times 4) within each super-VGB in the embodiment 300 of FIGS. 3A–3D. A particular, coarsely-granulated configuration of the FPGA device 300 may call for each CBB to consume a corresponding MaxL driver. This would make full efficient use of the MaxL driving resources of the super-VGB.

On the other hand, an alternate, more finely-granulated configuration of the FPGA device 300 may call for a larger number of CBE's (more-finely granualated, Configurable Building Elements, not shown) in a first super-VGB to each drive a corresponding MaxL driver. This would exceed the longline driving capabilities of the first super-VGB. However, it may be in the alternate configuration that there are an adjacent one or more other super-VGB's whose MaxL drivers are not fully consumed and are accessible via the feedthrough lines (FTX, FTY) to the CBE's of the first super-VGB. In such a case, the excess CBE's of the first super-VGB can make efficient use of unconsumed MaxL drivers in the neighboring super-VGB's.

It is therefore seen that the use of shared high-powered drive amplifiers for supporting the high-powered drive needs of a larger number of CBE's (instead of using dedicated high-powered drive amplifiers on a one per CBE basis), means that the amount of integrated circuit space consumed on a per CBE basis (or even on a per VGB basis) is reduced. At the same time, the central sharing approach of each super-VGB increases the likelihood that each high-powered amplifier will be used by one of the multiple CBE's, CBB's or VGB's in the super-VGB or in a neighboring super-VGB. This is more efficient than having the large area of a given high-powered amplifier wasted because no CBE, CBB or VGB uses that high-powered amplifier.

The combination of FIGS. 3A–3D is also intended to demonstrate how result signals may be configurably routed to the longlines (MaxL lines) of either one of othogonal interconnect channels, or alternatively, simultaneously broadcast to the longlines of such othogonal interconnect channels. One embodiment of SOC's section 350 allows for such omni-directional routings.

Figure 4A:
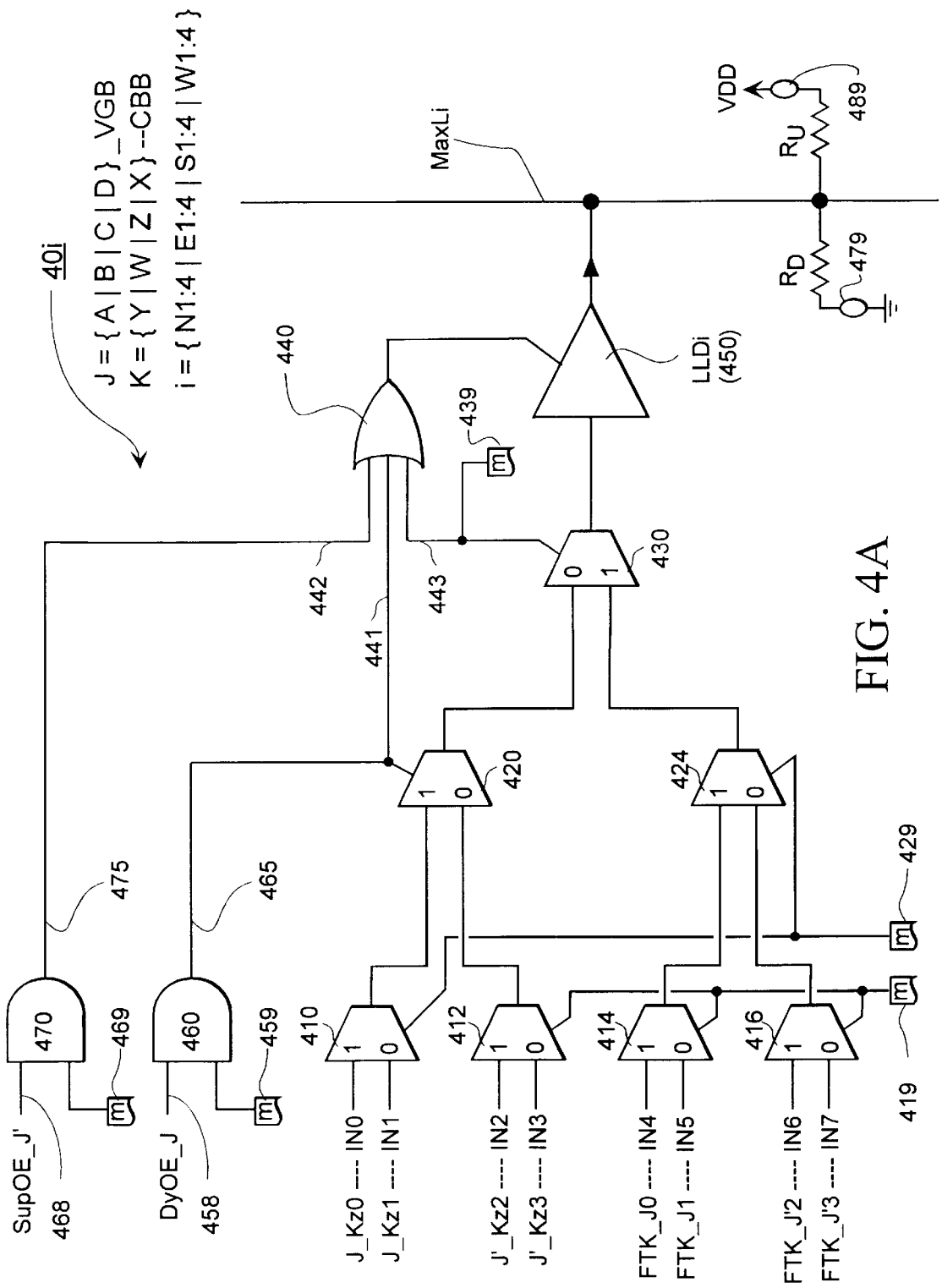
FIG. 4A is a schematic of shared, big drive logic for each MaxL line driver of a given super-VGB.
Figure 4C:
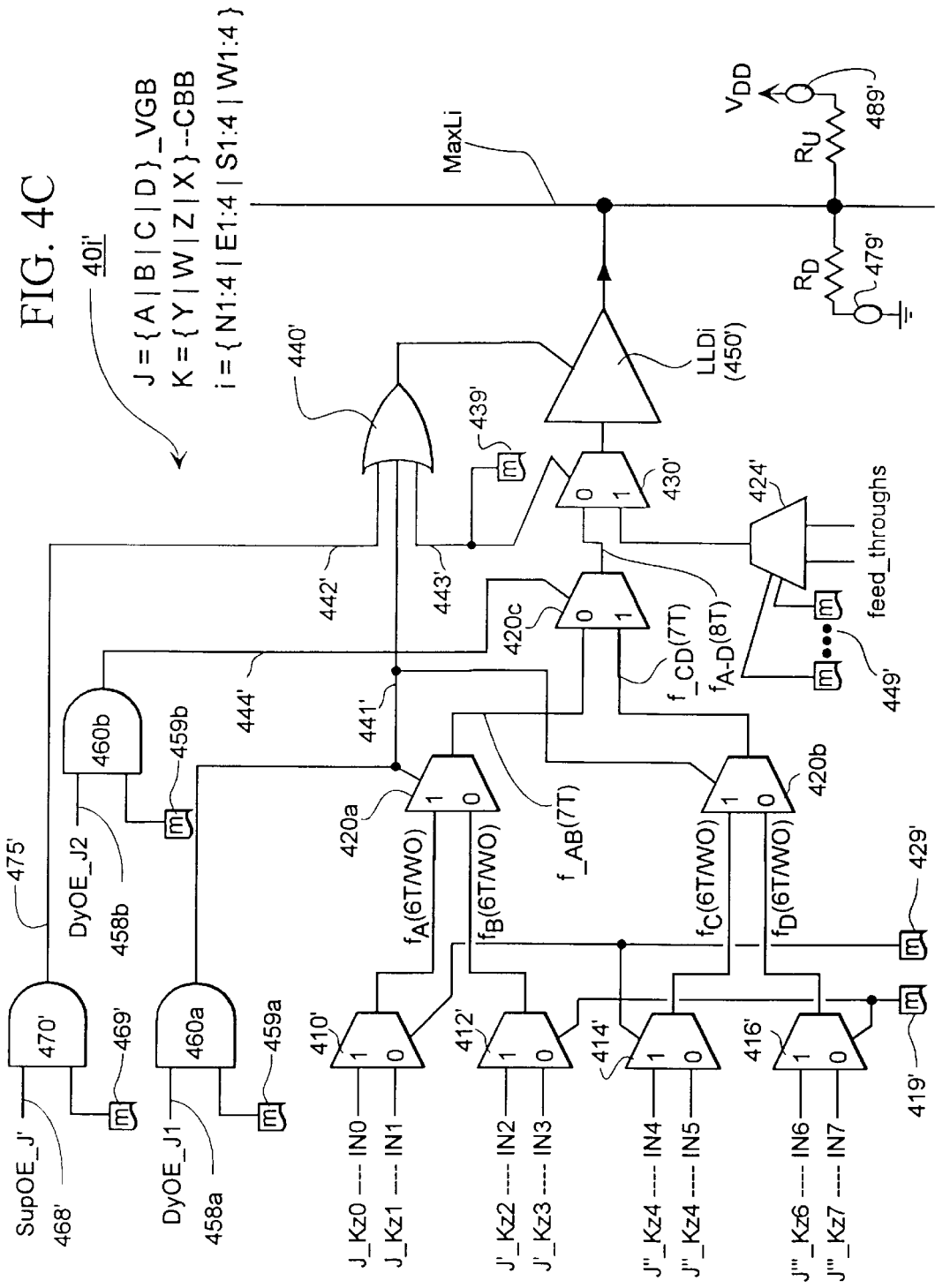
FIG. 4C is a schematic of an alternate shared, big drive logic for folding together the resources of 4 VGB's.

FIGS. 4A–4C illustrate a number of possible designs for the SOC's section 350 of FIG. 3A.

FIG. 4A is a schematic diagram of one SOC (Shared output components) circuit 40$i$ that interfaces with longline-driver (LLD) number i. The integer i may be any value of 1 through M, where M represents the respective plurality of M MaxL line drivers in the shared core 350 (FIG. 3A) of each super-VGB. As already explained, in one embodiment, M=16. These 16 drivers are uniformly distributed as: (a) 4 northern MaxL line drivers for driving a respective 4 northern MaxL lines adjacent to the super-VGB; (b) 4 eastern MaxL line drivers for a respective 4 eastern, adjacent MaxL lines; (c) 4 southern MaxL line drivers for a respective 4 southern, adjacent MaxL lines; and (d) 4 western MaxL line drivers for a respective 4 western, adjacent MaxL lines.

In FIG. 4A, each of the symbols J or J' may represent a respective one of the _A, _B, _C and _D VGB's of a given super-VGB. K designates one of the X, Z, W, and Y CBB's. FTK designates a feedthrough signal from a respective CBB. FIG. 4B provides a matrix showing a mix used in one embodiment. Other mixes are of course also possible. The respective inputs of static multiplexers 410–416 are named as IN0 through IN7, or alternatively as J__Kz0 through J'__Kz3 and as FTK__J0 through FTK__J'3 s as shown.

Multiplexers 410 and 414 form a shared logic section (580 in FIG. 5) associated with first VGB J while multiplexers 412 and 416 form the shared logic section (580') associated with second VGB J'. Dynamic multiplexer 420 and static multiplexer 424 are arranged outside of first and second VGB's J and J' since these multiplexers 420, 424 collect signals from both of VGB's J and J'.

Multiplexer 420 may be used to dynamically select between the configuration-defined output of either static multiplexer 410 or of static multiplexer 412. Configuration memory bit 419 drives the selection control terminal of multiplexer 412 as well as those of multiplexers 414 and 416. Configuration memory bit 429 drives the selection control terminal of static multiplexer 410 as well as that of multiplexer 424. The selection control terminal of dynamic multiplexer 420 is driven by AND gate 460. One input of AND gate 460 is driven by configuration memory bit 459. Another input of AND gate 460 is driven by the DyOE_J signal on line 458. This DyOE_J signal is a common-controls derived signal such as 558 of FIG. 5. Given that multiplexer 410 obtains a CBB output signal from a first VGB, J and that multiplexer 420 obtains a CBB output signal from a second VGB, J', when configuration memory bit 459 is at logic '1', the DyOE_J signal (458) passes through onto line 465 and as such may be used to dynamically select an output from one of VGB's J and J' as an input for longline driver LLDi (450). When line 465 is high (logic '1'), the output of multiplexer 410 is selected. When line 465 is low (logic '0'), the output of multiplexer 412 is selected. This is indicated by the placement of the '1' and '0' symbols at the data inputs of dynamic multiplexer 420. Such symbology is used throughout. As such, the basic operations of configuration memory bits 419, 429, 439, 459 and 469 are understood from the schematic. As will be further understood, configuration memory bit 439 should be set low, while bit 469 and line 468 may should be set high when it is desired to use line 458 as a dynamic selection control.

When configuration memory bit 439 is set high, the correspondingly-controlled multiplexer 430 passes through one of the feedthrough signals (IN4 through IN7) selected by static multiplexers 414, 416 and 424. The high on bit 439 also passes in this condition through input 443 of OR gate 440 to fixedly activate the output enable (OE) terminal of three-state longline driver 450. Signals on lines 441 and 442 of the OR gate become don't-cares under this condition.

If bit 439 is set low (logic '0'), a high on one of OR gate inputs 441 and 442 may alternatively pass through OR gate 440 to activate the OE terminal of tri-state driver 450. If all of configuration memory bits 439, 459 and 469 are set low, the tri-state driver 450 (LLDi) is disabled and placed in a high output impedance state (High Z). In one embodiment, the output stage of tri-state driver 450 features PMOS output transistors with channel widths of approximately 35 microns and NMOS output transistors with channel widths of approximately 15 microns.

Input line 468 of AND gate 470 represents an alternate or supplemental output enable. Like line 458, line 468 connects to one of the DyOE signals developed within the common control sections of the super-VGB (580 of FIG. 5). If configuration memory bit 469 is set high while each of bits 459 and 439 is low, the output of multiplexer 412 passes through multiplexers 420 and 430 to become the input of longline driver 450. The SupOE_J' signal of line 468 may act at the same time as a dynamic output enable that activates and deactivates tri-state driver 450 at desired times.

If configuration memory bit 459 is set high while each of bits 469 and 439 is low, output 465 functions as both a dynamic output enable for tri-state driver 450 and as a selector on multiplexer 420. Obviously, the '0' input of static means 420 is a don't-care in this situation because LLDi 450 is disabled when line 465 goes low under this situation and by happenstance selects the '0' input of multiplexer 420.

In one embodiment, one or more of the MaxL lines may be configurably connectable to a weak pull-up resistor $R_U$ and/or to a weak pull-down resistor $R_D$ via respective PIP's 479 and/or 489 as shown. Those skilled in the art will appreciate that narrow-channel pass-transistors of appropriate P or N type may be used to integrally implement both the resistive portion and the PIP portion of these line urging means 479 and/or 489. When PIP 489 is activated to resistively connect the MaxLi line to pull-up voltage $V_{DD}$, a wired-AND gate may be implemented on the MaxLi line if each line driver LLDi of that line has a zero at its input and the corresponding OE terminal of each such line driver LLDi receives an input signal of the wired-AND gate, for example, from line 475. In the latter case, the SupOE_J' signal of line 475 may be derived from a complex function signal that has been placed on an AIL of the super-VGB and has been acquired by an acquisition fingers of that VGB. As such, wired-ANDing of a plurality of complex function signals may be realized along the MaxLi line when desired.

Conversely, when PIP 479 is activated to resistively connect the MaxLi line to ground (logic '0'), a wired-OR gate may be implemented on the MaxLi line if each line driver LLDi of that line has a logic one at its input and the corresponding OE terminal of each such line driver LLDi receives an input signal of the wired-OR gate, for example, from line 475.

In an alternate embodiment, no pull-ups or pull-downs are provided on the MaxLi lines within the core of the FPGA. Instead, configuration-activatable, weak pull-up resistors ($R_U$) are provided only on a selected subset of longlines (4 lines in each VIC or HIC) within the peripheral interconnect channels. These peripheral NOR lines may be driven by adjacent IOB's and/or by the longline drivers of immediately adjacent super-VGB's to implement wide-input NOR functions.

In yet another alternate embodiment, keeper circuits such as 130 of FIG. A are employed on all or a select subset of the longlines.

Referring to the configurations matrix of FIG. 4B, note that the northern MaxL drivers N1:4 (N1 through N4) acquire their DyOE_J and SupOE_J' signals respectively from the northern VGB's _A and _B. Similarly, the eastern drivers E1:4 acquire their DyOE signals from eastern VGB's _B and _D; the southern drivers S1:4 acquire their DyOE signals from southern VGB's _D and _C; and the western drivers W1:4 acquire their DyOE signals from western VGB's _C and _A.

In similar vein, for the northern MaxL drivers N1:4, the IN0–IN3 signals are acquired respectively from the northern VGB's _B and _A. For drivers N1 and N3, dynamic selection is possible between the Y and X CBB's of VGB's _B and _A. For drivers N2 and N4, dynamic selection is possible between the Z and W CBB's. A corresponding pattern is shown for the other drivers, E1:4, S1:4 and W1:4.

Additionally, for the northern MaxL drivers N1:4, the IN4–IN7 feedthrough signals are acquired respectively from the FTX1 and FTX2 lines of northern VGB's _B and _A. A corresponding pattern is shown for the other drivers, E1:4, S1:4 and W1:4.

Note that same source signals are seen multiple times in the matrix of FIG. 4B. For example, the A_Yz CSE output signal may be routed to any one or all of the following tri-state drivers: N1, N3, W1 and W4. The FTX1_A feedthrough signal may be routed to any one or all of the following tri-state drivers: N1, N2, N3 and N4. The below Table-1 and Table-2 show the respective routing options for the CBB outputs and the feedthroughs.

TABLE 1

| VGB_CBB Output Source | Dest 1 | Dest 2 | Dest 3 | Dest 4 |
|---|---|---|---|---|
| A_Xz | N1 | N4 | W1 | W3 |
| A_Yz | N1 | N3 | W1 | W4 |
| A_Wz | N2 | N4 | W2 | W3 |
| A_Zz | N2 | N3 | W2 | W4 |
| B_Xz | N1 | N4 | E1 | E3 |
| B_Yz | N1 | N3 | E1 | E4 |
| B_Wz | N2 | N4 | E2 | E3 |
| B_Zz | N2 | N3 | E2 | E4 |
| C_Xz | S1 | S4 | W1 | W3 |
| C_Yz | S1 | S3 | W1 | W4 |
| C_Wz | S2 | S4 | W2 | W3 |
| C_Zz | S2 | S3 | W2 | W4 |
| D_Xz | S1 | S4 | E1 | E3 |
| D_Yz | S1 | S3 | E1 | E4 |
| D_Wz | S2 | S4 | E2 | E3 |
| D_Zz | S2 | S3 | E2 | E4 |

Note from the above Table-1 that a nibble's-worth of data may be output from a given VGB through four, same-directed MaxL drivers to the adjacent MaxL lines. For example, CBB outputs: A_Xz, A_Yz, A_Wz, and A_Zz, may be simultaneously and respectively routed to: N1, N3, N4 and N2. Alternatively, CSE outputs: A_Xz, A_Yz, A_Wz, and A_Zz, may be simultaneously and respectively routed to: W3, W1, W2 and W4.

TABLE 2

| Feedthrough Source | Dest 1 | Dest 2 | Dest 3 | Dest 4 |
|---|---|---|---|---|
| FTX1_A | N1 | N2 | N3 | N4 |
| FTX2_A | N1 | N2 | N3 | N4 |
| FTY1_A | W1 | W2 | W3 | W4 |
| FTY2_A | W1 | W2 | W3 | W4 |
| FTX1_B | N1 | N2 | N3 | N4 |
| FTX2_B | N1 | N2 | N3 | N4 |
| FTY1_B | E1 | E2 | E3 | E4 |
| FTY2_B | E1 | E2 | E3 | E4 |
| FTX1_C | S1 | S2 | S3 | S4 |
| FTX2_C | S1 | S2 | S3 | S4 |
| FTY1_C | W1 | W2 | W3 | W4 |
| FTY2_C | W1 | W2 | W3 | W4 |
| FTX1_D | S1 | S2 | S3 | S4 |
| FTX2_D | S1 | S2 | S3 | S4 |
| FTY1_D | E1 | E2 | E3 | E4 |
| FTY2_D | E1 | E2 | E3 | E4 |

Note from the above Table-2 that a nibble's-worth of data may be fedthrough from parallel legs of a given pair of adjacent VGB's through four, same-directed MaxL drivers to the adjacent MaxL lines. For example, feed-through outputs: FTX1_A, FTX2_A, FTX1_B and FTX2_B, may be simultaneously and respectively routed to: N1, N2, N3 and N4. Alternatively, feedthrough outputs: FTY1_A, FTY2_A, FTY1_C and FTY2_C may be simultaneously and respectively routed to: W1, W2, W3 and W4.

FIG. 4C is a schematic diagram of an alternate design for each SOC circuit 170$i'$ where i' equals 1 through M for the respective plurality of M MaxL line drivers in the shared core 350 (FIG. 3A) of each super-VGB. Like reference numerals in the '400' century series are used in FIG. 4C for elements having like counterparts in FIG. 4A. As such, the functions of most of the like-numbered elements will be understood by implication.

A major difference in the alternate SOC circuit 170$i'$ of FIG. 4C is that dynamic selection is carried one level deeper to produce signal $f_{A-D}$(8T) at the output of dynamic multiplexer 420c, where signal $f_{A-D}$(8T) can be any function of as many as 8 independent input terms. In essence, the function synthesis capabilities of all four VGB's (_A through _D) of the encompassing super-VGB are being folded together in the alternate shared logic circuit 170$i'$.

To produce the $f_{A-D}$(8T) signal, each of multiplexers 410', 412', 414' and 416' receives Kz signals from respective ones of VGB's _A through _D and statically selects a subset of the supplied Kz signals. Multiplexer 410' produces a first 6-term (or wide-output) signal, $f_A$(6T/WO) which was synthesized in VGB_A. Multiplexer 412' produces a second 6-term (or wide-output) signal, $f_B$(6T/WO) which was synthesized in VGB_B. Multiplexer 414' produces a third 6-term (or wide-output) signal, $f_C$(6T/WO) which was synthesized in VGB_C. Multiplexer 416' produces a fourth 6-term (or wide-output) signal, $f_D$(6T/WO) which was synthesized in VGB_D.

Multiplexer 420a dynamically selects between $f_A$(6T/WO) and $f_B$(6T/WO) in response to selection control signal 441' which may be developed from DyOE_J1 by AND gate 460a. In similar fashion, multiplexer 420b dynamically selects between $f_C$(6T/WO) and $f_D$(6T/WO) in response to selection control signal 441' (or in yet a further alternative embodiment, in response to a different selection control signal which is derived from another DyOE signal supplied by a VGB). The outputs of dynamic multiplexers 420a and 420b are therefore respectively denoted as $f_{\_AB}$(7T) and $f_{\_CD}$(7T) to indicate they can be any function of up to 7 independent input terms.

Multiplexer 420c dynamically selects between $f_{\_AB}$(7T) and $f_{\_CD}$(7T) in response to selection control signal 444' which is developed from DyOE_J2 by AND gate 460b. DyOE_JL1 can be produced by the common controls section (580) of one VGB while DyOE_J2 can be simultaneously produced by the common controls section of a second VGB. Signal SupOE_J' (468') may be simultaneously produced by the common controls section of a third VGB of the same super-VGB. The choice of which VGB produces which of signals DyOE_J1, DyOE_J2 and SupOE_J' can vary.

As is further seen in FIG. 4C, multiplexer 430' statically selects either the $f_{A-D}$(8T) output signal of multiplexer 420c or a feedthrough signal that is statically selected by, and provided by, multiplexer 424'. The output of multiplexer 430' is coupled to the input of tristate driver 450'. Although not shown, it is understood that multiplexer 424' is coupled to receive respective feedthrough signals (FTX and/or FTY) from each of VGB's _A through _D and to statically select one of those feedthrough signals in accordance with configuration data stored in the FPGA device's configuration memory at 449'.

The dynamically multiplexing capabilities of multiplexers 420a, 420b and 420c may be used to dynamically multiplex respective output signals $f_A$(), $f_B$(), $f_C$(), and $f_D$() of a respective four different VGB's (e.g., J=A, J'=B, J"=C and J'''=D) through LLDi 450' at different times. The SupOE_J' signal (468') may be used to activate the OE terminal of LLDi 450' when DyOE_J1 (458) is at logic '0' (and configuration memory bit is also '0').

Figure 5:
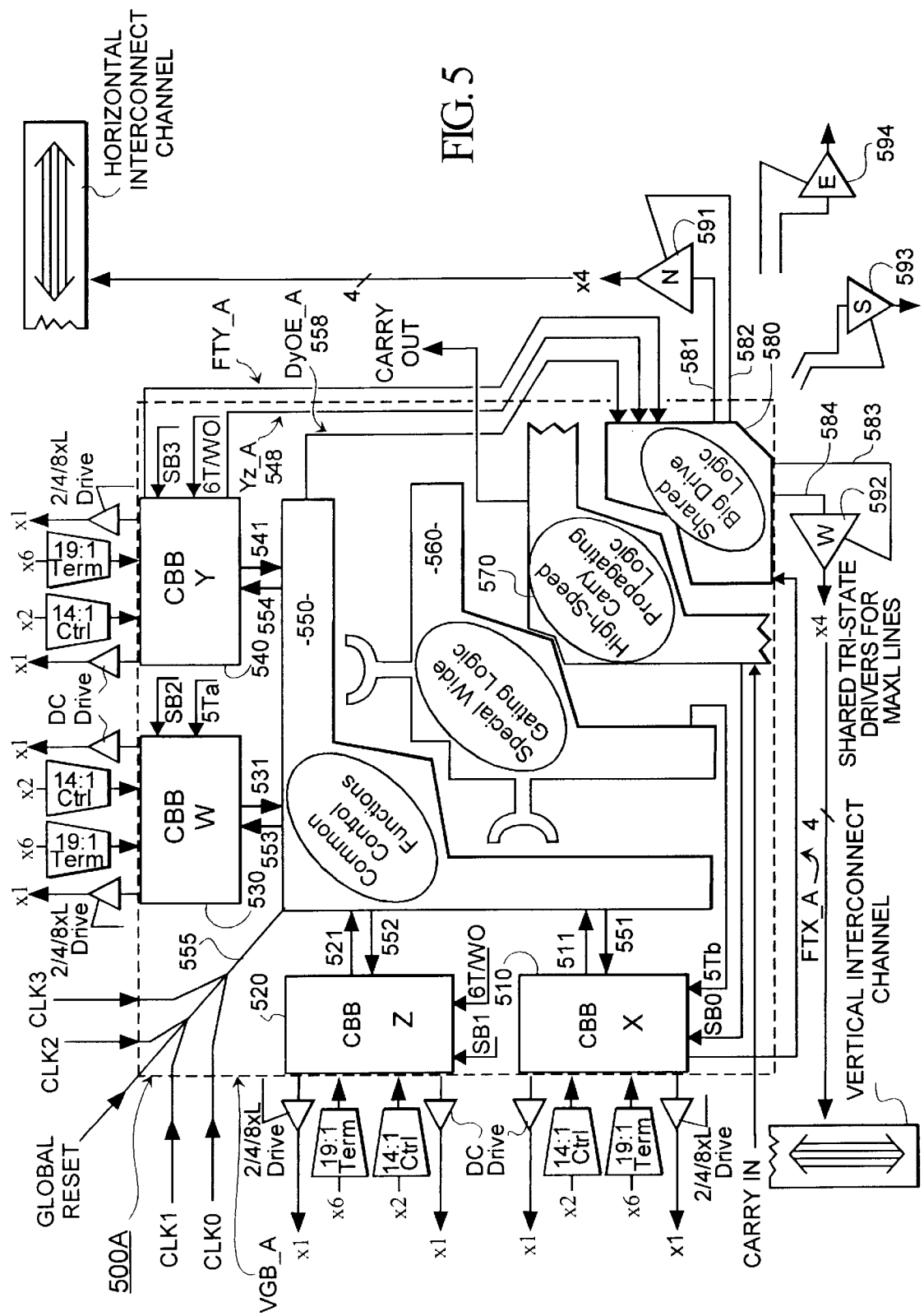
FIG. 5 illustrates an embodiment of one quadrant of a SVGB structure.

FIG. 5 shows various details within a SVGB quadrant in accordance with the invention. This quadrant includes Variable Grain Block 500A (also referred to as VGB__A) that is further in accordance with the present invention. VGB__A (500A) is shown in FIG. 5 at a more microscopic viewing level than that of FIG. 1B. It is understood that the other VGB's, namely, __B, __C and __D of each super-VGB have similar resources arranged in respective mirror-opposed symmetry with those of the illustrated VGB__A. It is also understood that other schemes for forming a VGB are possible.

The common controls developing section 550 of FIG. 5 collects a first plurality of control signals 511, 521, 531 and 541 from respective CBB's 510 (X), 520 (Z), 530 (W), and 540 (Y) of the illustrated VGB. These control signals are acquired by way of respective, controls input multiplexers (14:1 Ctrl) of the respective CBB's X,Z,W,Y. There are two such controls inputting, static multiplexers (14:1 Ctrl) dedicated to each CBB. Each pair of controls input multiplexers may be considered part of the CBB to which they are dedicated as are the dedicated direct-connect (DC) drive amplifier, the 2/4/8xL drive amplifier, and the six 19:1 terms input multiplexers (19:1 Term) of each CBB.

The common controls developing section 550 further collects a second plurality of control signals 555 directly from the adjacent horizontal and vertical interconnect channels (HIC and VIC) without using the signal acquisition fingers of the surrounding CBB's. Signals 555 include the following: GR (Global Reset/Set), CLK0, CLK1, CLK2 and CLK3. CLK0 and CLK1 are clock signals that come directly off the vertical interconnect channel. CLK2 and CLK3 are clock signals that come directly off the horizontal interconnect channel. GR is a Global Reset/Set signal that is universally available to all VGB's and therefore has no directional constraints. It may be using for setting or resetting flip flops within the VGB in accordance with a static configuration made by the common controls section. See the example of FIG. 6. As such, GR is shown as coming in diagonally into the VGB. Such diagonal disbursement of the GR signal is not generally the best way to distribute GR. It can be alternatively carried in one or both of the vertical or horizontal interconnect channels. In one embodiment, the GR signal is carried by a dedicated GR longline provided in each of the VIC's.

Common controls developing section 550 processes the collected signals 511, 521, 531, 541, and 555, and then returns corresponding, VGB-common control signals back to the CBB's as indicated by return paths 551 through 554. In one embodiment, individual return paths 551–554 are replaced by a common return bus that transmits the same returned control signals to all the CBB's of the VGB 500A.

Common controls developing section 550 of VGB__A also produces a 'for-sharing' dynamic control signal 558 (DyOE__A) which signal is forwarded to the super-VGB's shared logic section 580. A portion of this shared logic section 580 is seen in FIG. 5. It is understood that the common controls sections of the other VGB's within the subsuming super-VGB, namely VGB's: __B, __C, and __D, respectively supply additional for-sharing, dynamic control signals DyOE__B, DyOE__C and DyOE__D (not shown) to shared logic section 580. Shared logic section 580 corresponds to SOC 150 of FIG. 1A.

Each CBB directs at least one of its respective, function output signals to shared logic section 580. Line 548 which feeds signal Yz__A to 580 is an example. It is understood that the remaining CBB's, namely, X, Z, and W of the same VGB__A respectively feed signals Xz__A, Zz__A, and Wz__A to 580. It is further understood that the CBB's of the other VGB's within the subsuming super-VGB, namely VGB's: __B, __C, and __D, respectively supply additional signals of like designations, Xz__J, Zz__J, Wz__J, and Yz__J to their respective sections 580, where __J designates here the respective one of VGB's __B, __C, and __D.

The designation 'DyOE' for signals such as 558 is intended to imply here that such a signal performs an output enabling function and that such a signal may additionally perform a dynamic selection function as be seen in FIG. 4A in the form of the DyOE__J signal 458. The designation 'Yz__A' for signals such as 548 is intended to imply here that such a signal may be output by a tri-state amplifier (or another like device having a high-Z/high output-impedance state) such as the illustrated quartet of northern HIC-driving amplifiers 591 and/or such as the illustrated quartet of western VIC-driving amplifiers 592.

Selected ones of the Xz__J, Zz__J, Wz__J, and Yz__J signals may be routed to respective ones of input terminals (e.g., 581 and 584) of the longline driving amplifiers 591 through 594. At the same time, selected ones of the DYOE signals may be routed to respective ones of the output-enable control terminals (e.g., 582 and 583) of the longline driving amplifiers 591 through 594. Shared resources 591 through 594 may thus be used by any of the CBB's for outputting a result signal onto VGB-adjacent longlines. Although FIG. 5 only shows the connections of the respective northern quartet 591 and western quartet 592 of driving amplifiers to the north HIC and west VIC, it is understood that the southern quartet 593 and eastern quartet 594 of driving amplifiers similarly connect to a respectively adjacent, south HIC and east VIC.

Each VGB such as 500A further includes a wide gating control section 560. Section 560 collects more primitive function signals of the form $f_a(3T)$ and $f_y(4T)$ from respective CBB's X, Z, W, and Y and fold these together to generate higher level function signals of the form $f_A(nT)$ where nT indicates more independent input parameters than the number of input parameters that define the folded-together, primitive function signals. In one embodiment, the form $f_A(nT)$ includes higher level function signals $f_{WY}(5T)$ and $f_{XZWY}(6T)$ where the subscript such as in $f_{WY}()$ indicates the sources of the folded-together signals. In FIG. 5, the signal designated as 5Ta corresponds to $f_{WY}(5T)$. The signal designated as 5Tb corresponds to $f_{XZ}(5T)$. As seen by the example of CBB X, the wide gating control section 560 produces these signals and then returns them to respective CBB's for output or other processing.

Although not shown, the wide gating control section 560 includes a 16-bit LUT that is also referred to herein as the 'wide-output' or WO__LUT. This VGB-centralized WO__LUT can receive the more primitive function signals of the form $f_a(3T)$ and $f_y(4T)$ from the CBB's at its respective four input terminals and can generate a corresponding $f_{WO}(nT)$ function signal at its output. The wide gating control section 560 further includes a multiplexer (not shown) for selecting one or the other of the $f_{WO}(nT)$ function signal or the $f_{XZWY}(6T)$ function signal. In FIG. 5, the signal designated as 6T/WO corresponds to the output of this multiplexer. As seen by the example of CBB Y, the wide gating control section 560 produces the 6T/WO signal and then returns it to respective CBB's for output or other processing.

Each VGB such as 500A further includes a carry-chaining section 570. CBB X (510) receives a sum bit SB0 from carry-chaining section 570. This SB0 bit represents the least significant result bit of an addition or subtraction operation that starts in CBB 510 and completes in section 570. CBB Z (520) likewise receives a next more significant sum bit SB1 from section 570. Element 530 (the W CBB) receives a yet more significant sum bit SB2 from section 570. And element 540 (the Y CBB) receives the most significant sum bit SB3 of the VGB from section 570. Each of CBB's 510–540 has the capability to output its respectively received sum bit SB0–SB3 to points outside the VGB.

As already mentioned, feed-through signals may be acquired by respective CBB's and fed-through without further transformation to the shared output components (SOC) section 580. In FIG. 5, the signals designated as FTY_A and FTX_A are examples of such feed-through signals.

Figure 6:
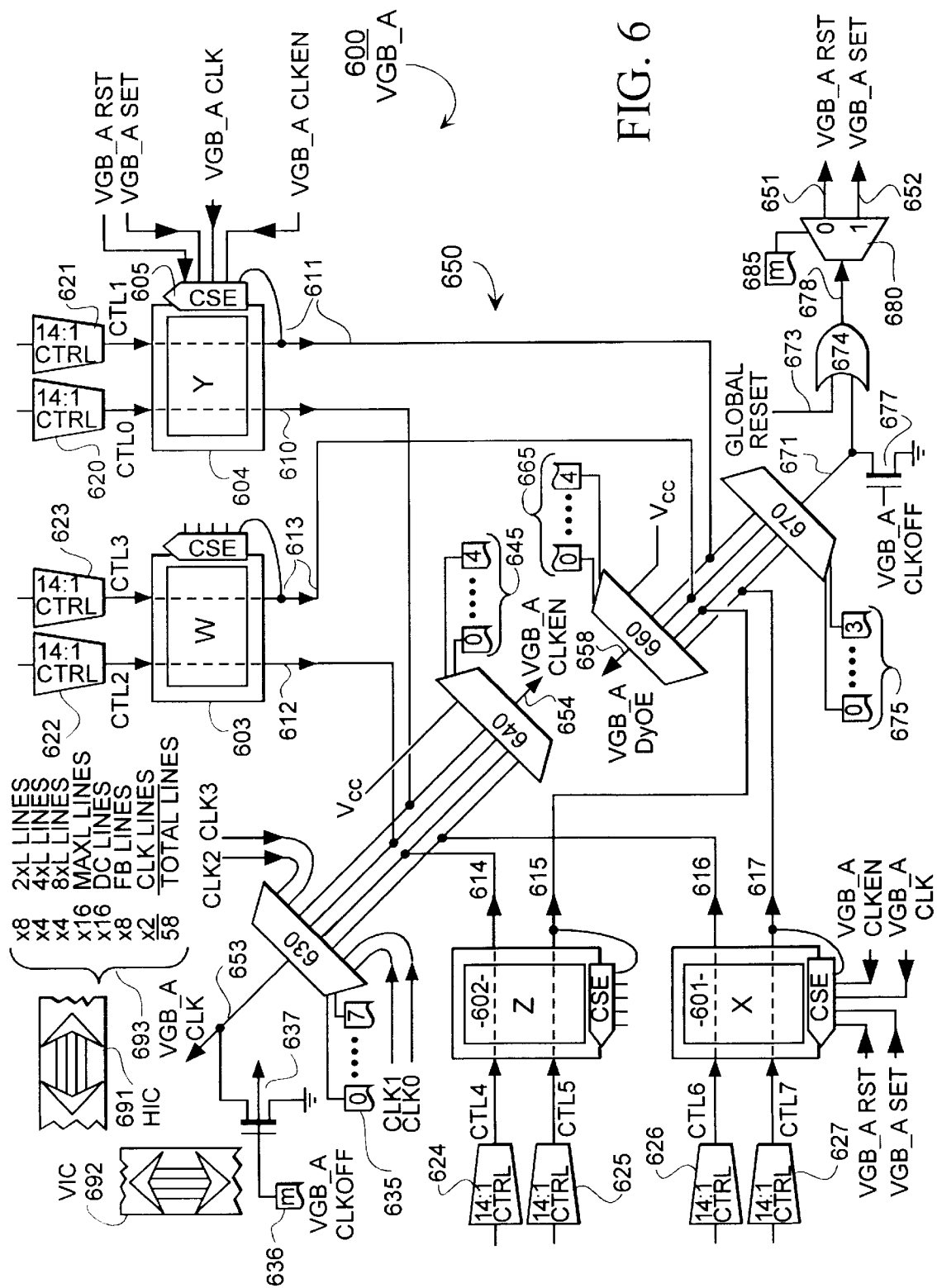
FIG. 6 is a schematic showing an embodiment of a common controls section within a VGB.

FIG. 6 illustrates an example of a common controls section for developing the DyOE signal of each respective VGB. In embodiment 650 of the common controls section, the returned control signals include a VGB_A RST (reset) signal 651, a VGB_A SET signal 652, a VGB_A CLK (clock) signal 653 and a VGB_A CLK_EN (clock enable) signal 654. These returned control signals 651–654 are returned to Configurable Sequential Elements (CSE's) of each CBB within the corresponding VGB. One such CSE is shown at 605 as part of the Y CBB 604 with the VGB_A RST, VGB_A SET, VGB_A CLK, and VGB_A CLK_EN signals being fed to it. The CSE's of the remaining CBB's 601(X), 602(Z) and 603(W) are understood to receive the same returned control signals 651–654.

In addition to the returned common control signals 651–654, each CSE receives a local control signal from its own CBB. Thus, CSE 605 receives local control signal 611 (which is alternatively denoted as CTL1) from its corresponding Y CBB 604. The CSE of the W CBB 603 similarly receives a local control signal 613 (CTL3). The CSE of the Z CBB 602 similarly receives a local control signal 615 (CTL5). The CSE of X CBB 601 similarly receives a local control signal 617 (CTL7).

Other locally-acquired control signals of the CBB's 601–604 are respectively shown at 616, 614, 612 and 610. These locally-acquired control signals 610–617 are each obtained from locally-adjacent interconnect lines by means of a control-signal acquiring resource (CIE) of the respective CBB. CBB Y (604), for example, is seen to have two 14-to-1 control-acquiring multiplexers 620 and 621. Multiplexers 620 and 621 cross with the locally-adjacent horizontal interconnect channel (HIC) 691 in a partially populating manner. See FIG. 7.

By 'partially populating', it is meant here that HIC 691 contains more interconnect lines than are connected to by any one of multiplexers 620 and 621. Each of multiplexers 620 and 621 contains a unique subset of programmable-interconnect-points (PIP's) that form a partially-filled crossbar with HIC 691 rather than a fully-populated crossbar with HIC 691. Use of such partially-populated crossbars in place of fully-populated crossbars is known in the art. The advantage is reduced capacitive loading on the interconnect lines. The disadvantage is reduced flexibility in choosing which interconnect lines (of HIC 691) will serve as a source for an acquired control signal.

In the illustrated example, HIC 691 (the horizontal interconnect channel) contains the following resources: eight double-length (2xL) lines, four quad-length(4xL) lines, four octal-length (8xL) lines, sixteen full-length (MaxL) lines, sixteen direct-connect (DC) lines, eight feedback (FB) lines and two dedicated clock (CLK) lines. This total of 58 lines is summarized at 693 in FIG. 6.

From among these 58 lines, the two dedicated clock (CLK) lines do not participate in the partially populating scheme of each of multiplexers 620 and 621 or in the partially populating scheme of each of the linearly adjacent, multiplexers 622 and 623. The remaining 56 HIC lines may be subdivided into four unique subsets of 14 lines each (4×14=56). In accordance with the invention, each of control-acquiring multiplexers 620–623 has its respective 14 inputs (MIP's) connected to a respective one of the four unique subsets of lines. Thus, a control signal may be acquired from any one of the locally-adjacent 56 HIC lines by at least one of the adjacent four multiplexers 620–623.

The adjacent vertical interconnect channel (VIC) 692 contains a same mix of interconnect resources (although not the same lines) and further carries the global reset (GR) line. Except for this GR line and the two dedicated CLK lines, the remaining 56 lines of VIC 692 may be subdivided into four unique subsets of 14 lines each. And in accordance with the invention, each of control-acquiring multiplexers 624–627 has its respective 14 inputs (MIP's) connected to a respective one of the four unique subsets of VIC lines. Thus, a control signal may be acquired from any one of the locally-adjacent 56 VIC lines by at least one of the adjacent four multiplexers 624–627. However, it should be understood that once one of four multiplexers 624–627 is consumed for acquiring a first control signal from its unique subset of VIC lines, connection to the remaining lines of that unique subset via that consumed multiplexer is no longer possible.

Figure 7:
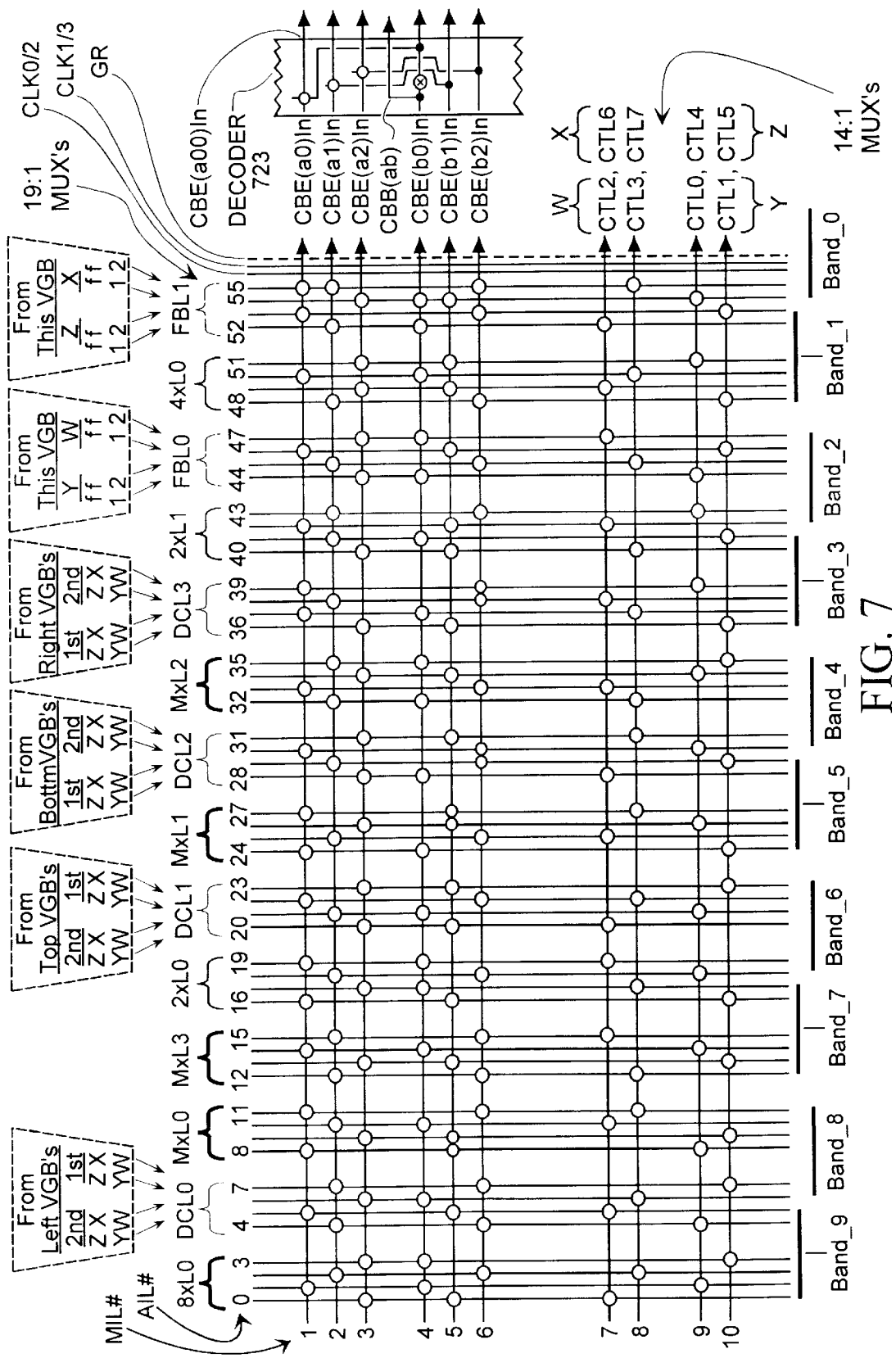
FIG. 7 illustrates an MIL fingers arrangement in accordance with the invention.

FIG. 7 illustrates one partial-populating scheme in accordance with the invention for the 56 lines of each HIC or VIC. It is within the contemplation of the invention to use other partial populating patterns. It is also within the contemplation of the invention to have overlap between acquirable line sets by using control acquiring multiplexers with more MIP's if desired, but of course that also increases space utilization within the integrated circuit.

Because each of the control-signal acquiring multiplexers 620 through 627 (FIG. 6) is capable of acquiring control signals from a unique subset of lines in respective one or the other of HIC 691 and VIC 692, the combination of multiplexers 620 through 627 can acquire control signals from an even larger unique subset of adjacent interconnect lines (AIL's). In accordance with the invention, the control-signal acquiring capabilities of all the peripheral multiplexers 620–627 are made common to the VGB 600.

As such, it is seen that a resource-merging multiplexer 630 is provided in section 650 with eight inputs for respectively receiving the following signals: 614 and 616 (respectively from multiplexers 624 and 626 of the Z and X CBB's), 610 and 612 (respectively from multiplexers 620 and 622 of the Y and W CBB's), CLK0 and CLK1 (directly from VIC 692), and CLK2 and CLK3 (directly from HIC 691). Multiplexer 630 may output a selected one of these eight inputs onto the VGB_A CLK line 653. Alternatively, line 653 may be pulled low by N-channel transistor 637. The gate of transistor 637 is driven by configuration memory bit 636. Signal 636 (VGB_A CLKOFF) is also applied to the gate of a later-described, second transistor 677.

The eight inputs of multiplexer 630 may be independently selected or not in accordance with the setting of eight corresponding configuration memory bits 0 through 7, which bits are indicated at 635. The logic levels on line 653 define the VGB_A CLK signal that is commonly applied to the CSE's of the corresponding VGB_A. When line 653 is pulled low by transistor 637, corresponding flip-flops (not shown) in each of the CSE's (e.g., 605) are blocked from changing state.

A second resource-merging multiplexer 640 is provided in section 650 for also receiving control signals 610 (CTL0), 612 (CTL2), 614 (CTL4) and 616 (CTL6). Multiplexer 640 has a fifth input which receives the Vcc signal (logic 1). Five configuration memory bits 645 may be respectively used to designate which of the inputs of multiplexer 640 will appear on its output line 654 (VGB_A CLKEN_). When line 654 is high (at Vcc), the commonly controlled flip-flops in the CSE's of VGB_A are enabled to respond to the clock signal on line 653.

A third resource-merging multiplexer 670 of section 650 has four input terminals respectively connected to receive the following control signals: 611 (CTL1 from multiplexer 621), 613 (CTL3 from multiplexer 623), 615 (CTL5 from multiplexer 625) and 617 (CTL7 from multiplexer 627). Four configuration memory bits 675 may be respectively used for causing one or none of the four inputs to appear on output line 671. N-channel transistor 677 is further coupled to line 671 for driving line 671 low (to logic 0) when the VGB_A CLK0FF memory bit 636 is high.

Line 671 connects to a first input of OR gate 674. A second input of OR gate 674 receives the global reset signal (GR) by way of line 673. The output of OR gate 674 is applied to an input 678 of de-multiplexer 680. Configuration memory bit 685 controls de-multiplexer 680. If memory bit 685 is in the logic zero state, the dynamic signal on output line 678 appears on output line 651 of the de-multiplexer 680 while output line 652 remains in the inactive, default state (no SET). Conversely, if memory bit 685 is in the logic 1 state, the dynamic signal on output line 678 is transferred to output line 652 (VGB_A SET) while line 651 remains in the inactive, default state (no RESET).

De-multiplexer 680 therefore enables either of the global reset (GR) signal on line 673 or the local reset signal on line 671 to be programmably directed to act as a set or reset signal for the commonly controlled flip-flops (not shown) of all the CSE's in VGB_A 600. The CLK0FF configuration bit 636 can be used to block the local reset signal from appearing on line 671.

A fourth resource-merging multiplexer 660 is provided within section 650 for receiving the following input signals: 611 (CTL1), 613 (CTL3), 615 (CTL5) and 617 (CTL7). Multiplexer 660 additionally receives the Vcc level at a fifth input. Five configuration memory bits 665 determine which, if any, of the five inputs of multiplexer 660 will appear on output line 658 (VGB_A DyOE). The VGB_A DYOE signal 658 is supplied to the shared logic section 580 of the VGB as indicated by 558 in FIG. 5.

FIG. 7 illustrates a partial-populating scheme for the input-term and control-signal acquiring fingers (multiplexers) of the respective X, Z, W, and Y Configurable Building Blocks of one embodiment in accordance with the invention. The adjacent interconnect lines (AIL's) are respectively numbered as 0 through 55. The two dedicated CLK lines of each interconnect channel and the additional GR line in each VIC are not included in this count. In one embodiment, AIL's 0–55 represent interconnect lines in the most immediately adjacent channel for each of CBB's X, Z, W, and Y.

In an alternate embodiment, AIL's 0–55 represent interconnect lines in the most immediately adjacent channel for each of CBB's X and Y while for the other CBB's, Z and W, the AIL's 0–55 of FIG. 7 represent the interconnect lines of the next adjacent channel. The exception is at the periphery of the matrix (see FIG. 2) where there is no next adjacent channel, in which case AIL's 0–55 represent interconnect lines in the most immediately adjacent channel also for CBB's Z and W. This alternate configuration allows each VGB to acquire input term signals and control signals from both the even-numbered and odd-numbered interconnect channels that surround it. It is of course within the contemplation of the invention to have other configurations, such as for example wherein the CBB's that reach the most immediately adjacent channel are X and W rather than X and Y; and such as wherein the CBB's that reach the next adjacent channel are X and Y rather than Z and W.

Multiplexer input lines (MIL's) are numbered in FIG. 7 as 1 through 10. MIL's 1–3 correspond to the three 19:1 input term acquiring multiplexers (fingers) of a first CBE (e.g., 'a') in each of the X, Z, W, Y CBB's. MIL's 4–6 correspond to the three 19:1 input term acquiring multiplexers of a second CBE (e.g., 'b') in each of the X, Z, W, Y CBB's. MIL's 7–8 correspond to the two 14:1 control signal acquiring multiplexers of each of the W and X CBB's. MIL's 9–10 correspond to the two 14:1 control signal acquiring multiplexers of each of the Y and Z CBB's.

The illustrated partially-populated distribution of PIP's over the intersections of AILS's 0–55 and MIL's 1–10 should be self-explanatory. Each open circle represents a statically-programmable interconnect point through which entering lines continue linearly in the schematic. Activation of the PIP creates a closed connection between the crossing-through lines. Deactivation of the PIP during the FPGA configuration phase leaves the crossing-through lines disconnected from one another. The only exception to this is the POP symbol (open circle with an 'X' in it) shown coupled to CBE(b0)In. Activation of the POP (Programmable Opening Point) creates an open circuit between the colinear lines of that symbol. Deactivation of the POP during the FPGA configuration phase leaves the colinear lines of that symbol connected to one another.

AIL's 0–3 represent the four 8xL lines in each interconnect channel. AIL's 4–7 represent a first group (DCL0) of four of the 16 direct connect lines in each interconnect channel. The remaining DCL's are represented by the 20–23 (DCL1), 28–31 (DCL2) and 36–39 (DCL3) sets of AIL's. AIL's 8–11 represent a first group (MxL0) of four of the 16 MaxL lines in each interconnect channel. The remaining MxL's are represented by the 24–27 (MxL1), 32–35 (MxL2) and 12–15 (MxL3) sets of AIL's.

AIL's 16–19 represent a first group (2xL0) of four of the 8 2xL lines in each interconnect channel. The other four 2xL lines are represented by the 40–43 (2xL1) group. AIL's 44–47 represent a first group (FBL0) of four of the 8 feedback lines in each interconnect channel. The other four feedback lines are represented by the 52–55 (FBL1) group. AIL's 48–51 represent the four 4xL lines in each interconnect channel.

Signal sources for the direct connect lines and the feedback lines are indicated respectively above corresponding AIL groups. In group DCL0 for example, AIL 7 is driven by either the X or the W DC driver of the neighboring VGB that is immediately to the left of the current VGB. AIL 6 is driven by either the Z or the Y DC driver of the neighboring VGB that is immediately to the left of the current VGB. AIL 5 is driven by either the X or the W DC driver of the next, not immediately-neighboring VGB that is to the left of the current VGB. AIL 4 is driven by either the Z or the Y DC driver of the next-adjacent VGB that is to the left of the current VGB.

Each of MIL's 0–6 is loaded by essentially the same number of 19 PIP's that form the corresponding 19:1 multiplexer. As such, there is roughly a same amount of signal propagation delay in going through each such multiplexer to the corresponding LUT. There is some additional delay or loading from PIP's and POP's that form the intervening decoder layer. A representative part of that layer is shown at 723.

Note that for each of AIL's 0–55 there are at least two PIP connections to two different MIL's, one of which is placed in the MIL# 1–3 set and another of which is in general, differently placed in the MIL# 4–6 set. In other words, are at least two possible MIL's which can be used to acquire an input term signal moving along a given AIL and feed the acquired signal to one or the other of two possible LUT's ('a' or 'b') of the subsequent primitives layer. Thus if one of the two 19:1 multiplexers that can couple to a given AIL is already consumed, or the corresponding LUT is already consumed, the FPGA configuring software has the possibility of alternatively using the other multiplexer and/or LUT for implementing a design circuit chunk that requires a particular input term signal moving along the given AIL.

Each of AIL's 54 and 55 have at least three PIP connections to a respective three different MIL's. Feedback signals from the f1 and f2 lines of the X output element (CSE) therefore have 3 possible ways of being transmitted into the respective MIL 1–6 inputs of any one of the X, Z, W, and Y Configurable Building Blocks of the same VGB. These MIL 1–6 inputs are alternatively named as CBE(a0)In, CBE(a1)In, CBE(a2)In, CBE(b0)In, CBE(b1)In, and CBE(b2)In in FIG. 7. Note that CBE(b0)In is different from the others in that a POP (Programmable Opening Point) is provided for it in decoder section 723. CBB(ab) represents an intercepted signal that may be used for compounding or folding together the 'a' and 'b' parts of the corresponding CBB to thereby synthesize a larger LUT. The same CBB(ab) signal may also represents a feed-through signal (FTY or FTX), particularly when CBB(ab) is not needed for producing a folded-together function signal of the form $f_A(mT)$ where m>3.

Note also that in the case where the PIP's of the signal-acquiring multiplexers of FIG. 7 are of the bidirectional type, simultaneous activation of two or more PIP's on a same AIL (during FPGA configuration time), creates a bidirectional strapping inter-connection between the corresponding MIL's of those PIP's. Such a use of the PIP's of the signal-acquiring multiplexers of FIG. 7 falls herein under the description, 'through-the-AIL strapping'. Not every embodiment however can use this kind of through-the-AIL strapping in a generic way to strap from one MIL to a next a signal that had been generically sourced onto a line other than the strapping AIL. One of the requirements is that the PIP's in the signal-acquiring multiplexers of FIG. 7 be conductive enough (large enough in terms of RC time constant) to get signals through within the system-specified time. If these PIP's are too small, such use of through-the-AIL strapping should be avoided. On the other hand, if the signal that is being strapped onto the two MIL's was sourced onto the strapping AIL from an appropriate AIL drive amplifier, the size of the PIP's of the signal-acquiring multiplexers of FIG. 7 should not be an impediment to carrying on through-the-AIL strapping because the drive amplifier is designed to drive the signal in timely fashion through those loads.

Note further that in the case where the PIP's of the signal-acquiring multiplexers of FIG. 7 are again of the bidirectional type, simultaneous activation during FPGA configuration time of two or more PIP's on a same MIL (multiplexer input line), can create a bidirectional strapping interconnection between the corresponding AIL's of those PIP's. Such a use of the PIP's of the signal-acquiring multiplexers of FIG. 7 is referred to herein as 'through-the-MIL strapping'. The latter function may be particularly useful when a signal is being acquired via a direct connect line (DCL) from another VGB and it is desirable to simultaneously couple such a DCL-carried signal to another kind of AIL within the interconnect channel, say to a vertical 2xL line when the direct connect source was a horizontally displaced VGB. Again, not every embodiment can use through-the-MIL strapping. If the PIP's of the signal-acquiring multiplexers are too small, and the DC drive amplifiers are not powerful enough to drive the added load, the through-the-MIL strapping function should be avoided and other means should be used for routing signals. For example, switch boxes may include PIP's for providing configuration-defined coupling of a signal sourced on a passing-through direct connect line (not shown) to passing-through 2xL, 4xL and/or 8xL lines.

The connection arrangement shown in FIG. 7 illustrates one possible layout arrangement for the various, differentiated conductors of the interconnect channel. This layout organization is formed by spaced-apart, layout 'bands' 0 through 9 as shown at the bottom of FIG. 4. Each band (except 0) has 6 adjacent interconnect lines (AIL's) and generally 2 PIP's per multiplexer input line (MIL). Other layouts are of course possible.

Note that the lines of band 0 are positioned closest to the side of the corresponding CBB. This helps to minimize the distance that timing-critical signals such as CLK0-3 and GR (global reset) travel from a CBB source before entering into the CSS of a destination CBB. The lines of bands 1 and 2 are positioned successively next closest to the side of the corresponding CBB. This helps to minimize the length of VGB-circumscribing lines, particularly the so-called, feedback lines (of groups FBL0 and FBL1). The quad-length (4xL0) lines may be used to facilitate certain signal-strapping functions of an adjacent decoding layer 423, which is why the 4xL0 lines are also included in band 1. MaxL lines and direct connect lines (DCL's) tend to have substantially larger capacitances than FBL's and 2xL lines. The MaxL lines and DCL's are thus generally relegated to positions in the outer-more ones of bands 3–9 because distance of signal travel from a source CBB to a destination CBB, through one of these larger-capacitance conductors is less critical.

When the PIP-distribution scheme of FIG. 7 is used, each of the control-signal acquiring multiplexers MIL's 7–10 allows its respective CBB to acquire control signals from a unique subset of lines in respective one or the other of its adjacent HIC or VIC.

Figure 8A:
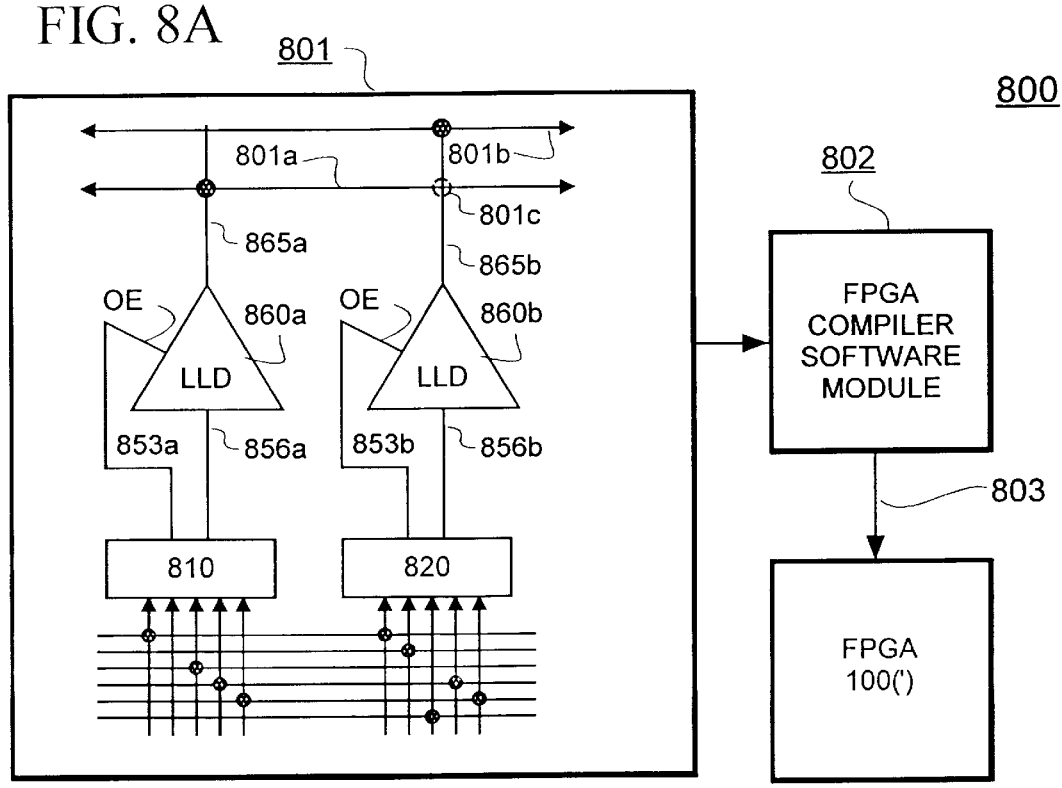
FIG. 8A is a block diagram of an FPGA configuring process.

Referring to FIG. 8A, a schematic diagram 800 is provided of an FPGA configuring process wherein a predefined design definition 801 is supplied to an FPGA compiling software module 802. Module 802 processes the supplied information 801 and produces an FPGA-configuring bitstream 803. Bitstream 803 is supplied to an FPGA such as 100 or 100' of respective FIGS. 1A and 1B for accordingly configuring the FPGA.

The design definition 801 may include either a shared line 801a that is to be driven by two line drivers, 860a and 860b, or two lines, 801a and 801b that are respectively to be driven at different times by respective line drivers 860a and 860b. Line drivers 860a and 860b may be tristate drivers or other kinds of drivers. The tristate versions of these drivers will include output enable terminals such as 853a and 853b. The drivers will also include inputs such as 856a and 856b.

In the design definition 801, first circuit 810 controls driver 860a for outputting signals onto line 801a at first predefined time slots. Circuit 820 respectively controls driver 860b for outputting other signals onto either line 801a or separate line 801b at different, second predefined time slots. Circuits 810 and 820 may share some common inputs as indicated by the bus connections illustrated below them. If the design definition 801 specifies that the first and second circuits 810 and 820 are to output their respective signals onto a shared line such as 801a, then dashed connection 801c would be present as part of the design definition 801.

It should be apparent in view of the above disclosure that circuit space in the FPGA may be conserved if the overlapping functions of line driver 860a and 860b can be combined. Also, interconnect resources in the FPGA may be conserved if separate lines 801*a* and 801*b* are specified in the design specification, and at the same time the output time slots for circuits 810 and 820 are mutually exclusive and do not conflict with time slots allotted for other signal sources (not shown). In such a case, lines 801*a* and 801*b* may be combined into a single shared line.

Figure 8B:
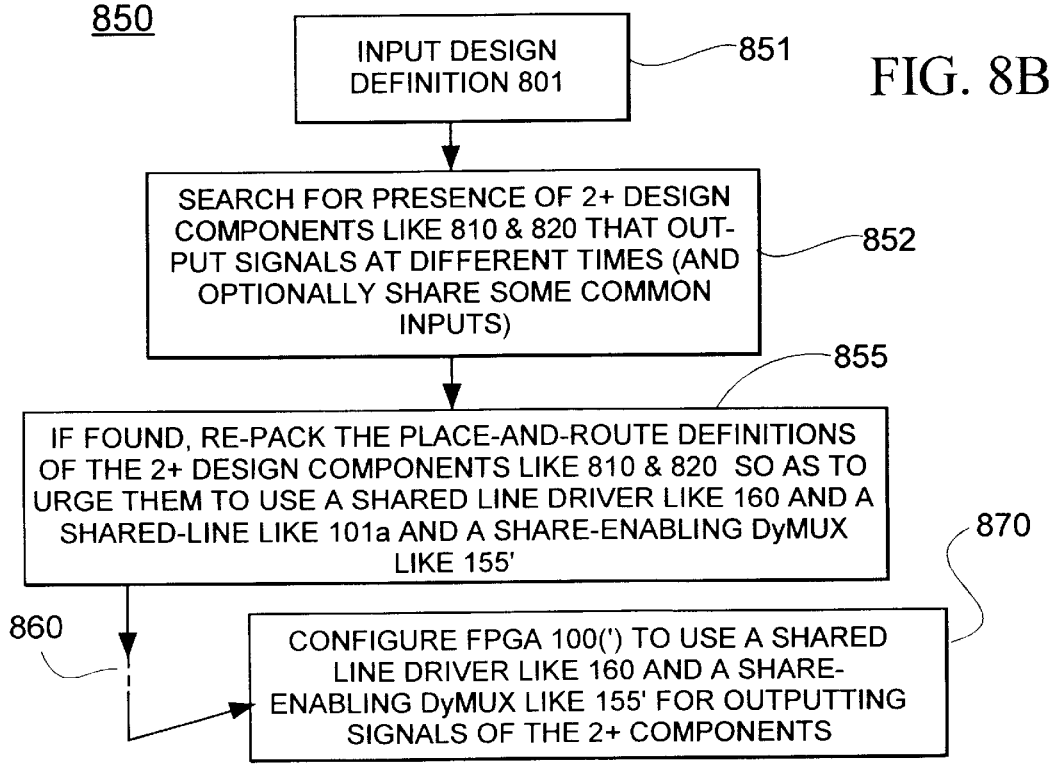
FIG. 8B is a flow chart of an FPGA configuring process that includes steps in accordance with the invention.

FIG. 8B illustrates a flow chart 850 of a process that attempts to obtain such space-saving and/or interconnect resource-saving results. A design definition such as 801 is input at step 851 into the FPGA compiler software module 802. Numerous processing steps may take place within software module 802. Step 852 is one of those steps in which the software module 802 searches through the input design definition (e.g., 801) for the presence of two or more design components like 810 and 820 that output signals at mutually exclusive times. The search criteria may optionally require the searched-for design components to also share one or more common inputs.

At step 855, if two or more design components like 810 and 820 are found to satisfy the search criteria, the place-and-route definitions of those design components are repacked so as to urge those definitions toward ultimately ending up using a shared line driver like 160' and a share-enabling dynamic multiplexer like 155' (FIG. 1B).

It is understood by those skilled in the art of FPGA configuration that many design factors may pull the two design components like 810 and 820 together toward a shared region of the FPGA and that other design considerations may push them apart. The urging factor produced in step 855 is just one of such pulling-together factors.

Dashed path 860 represents many other processes within the software module 802 wherein the original design definition 801 is transformed by steps such as design-partitioning, partition-placements and inter-placement routings to create a configuration file for the target FPGA 100 or 100'. Step 870 assumes that at least two design components like 810 and 820 were found and were ultimately partitioned and placed together so as to allow for the shared use of a line driver like 160' and a share-enabling dynamic multiplexer like 155'. In that case, at step 870 the target FPGA 100(') is configured to use a shared line driver like 160' and a share-enabling DyMUX like 155' for outputting signals of the two or more original design components like 810 and 820 onto a shared line like 801*a*.

Various modifications and variations in accordance with the spirit of the above disclosure will become apparent to those skilled in the art after having read the foregoing. For example, the shared line driver need not be a tristate line driver but instead may be another kind of line driver such as an open collector line driver. The shared line need not be a MaxL line but instead may be a shared line of slightly smaller length such as an 8xL line or a 16xL line.

Given the above disclosure of general concepts and specific embodiments, the scope of protection sought is to be defined by the claims appended hereto.

What is claimed is:

1. A method for multiplexing one of a plurality of signals into a shared line-driver within an FPGA, where said plurality of signals can be respectively supplied from plural variable grain blocks (VGB's) of said FPGA, where each VGB is programmably-configurable, where said FPGA further has disposed between said programmably-configurable VGB'S, a dynamic multiplexer having plural input terminals capable of respectively receiving said plurality of signals from the VGB's, and where said dynamic multiplexer further has a dynamically-controllable select terminal capable of dynamically selecting a signal on one of said plural input terminals for output from an output terminal of the dynamic multiplexer to the line-driver, said method comprising the steps of:

(a) configuring at least one of said VGB's to supply a selection signal to the select terminal of the dynamic multiplexer; and (b) configuring at least two of said VGB's to supply said plurality of signals respectively to the plural input terminals of the dynamic multiplexer.

2. The method of claim 1 wherein:

(a.1) said selection signal is supplied from a common controls section of the VGB.

3. The method of claim 1 wherein:

(a.1) said selection signal is obtained from one of plural acquisition fingers of the VGB.

4. The method of claim 1 wherein:

(b.1) said at least two VGB's each includes a plurality of Configurable Building Blocks for generating the respective signals.

5. The method of claim 1 wherein:

(b.1) said at least two VGB's each includes a plurality of acquisition fingers for acquiring from a set of adjacent interconnect lines (AIL's), a subset of acquired signals; and (b.1) said configuring of the at least two VGB's includes making use of the acquisition fingers to define said plurality of signals from the subset of acquired signals.

6. The method of claim 5 wherein said AIL's include conductor lines selected from at least two of a group consisting of:

(b.1a) a linear double-length (2xL) line;

(b.1b) a linear quad-length (4xL) line;

(b.1c) a linear octal-length (8xL) line.

7. The method of claim 5 wherein said AIL's include conductor lines selected from at least two of a group consisting of:

(b.1a) a linear maximum-length (MaxL) line;

(b.1b) a nonlinear direct connect line (DCL); and (b.1c) a nonlinear feedback line (FBL).

8. A programmed FPGA device comprising:

(a) a line-driver;

(b) a plurality of variable grain blocks (VGB's), wherein each VGB is programmably-configurable to supply a respective one of a plurality of signals for multiplexing into said line-driver;

(c) a dynamic multiplexer disposed between said programmably-configurable VGB's, said dynamic multiplexer having plural input terminals capable of respectively receiving said plurality of signals from the VGB's, and where said dynamic multiplexer further has a dynamically-controllable select terminal capable of dynamically selecting a signal on one of said plural input terminals for output from an output terminal of the dynamic multiplexer to the line-driver;

wherein:

(b.1) at least one of said VGB's is configured to supply a selection signal to the select terminal of the dynamic multiplexer; and (b.2) at least two of said VGB's are configured to supply said plurality of signals respectively to the plural input terminals of the dynamic multiplexer.

* * * * *